US009602117B2

(12) United States Patent
Maki et al.

(10) Patent No.: US 9,602,117 B2
(45) Date of Patent: Mar. 21, 2017

(54) DETECTION DEVICE, SENSOR, ELECTRONIC APPARATUS, AND MOVING OBJECT

(71) Applicant: Seiko Epson Corporation, Tokyo (JP)

(72) Inventors: Katsuhiko Maki, Chino (JP); Takashi Kurashina, Matsumoto (JP)

(73) Assignee: Seiko Epson Corporation (JP)

( * ) Notice: Subject to any disclaimer, the term of this patent is extended or adjusted under 35 U.S.C. 154(b) by 419 days.

(21) Appl. No.: 14/217,587

(22) Filed: Mar. 18, 2014

(65) Prior Publication Data

US 2014/0305185 A1 Oct. 16, 2014

(30) Foreign Application Priority Data

Mar. 22, 2013 (JP) ................................ 2013-060875

(51) Int. Cl.
G01C 19/5776 (2012.01)
H03M 1/06 (2006.01)
G01C 19/5614 (2012.01)

(52) U.S. Cl.
CPC ...... *H03M 1/0629* (2013.01); *G01C 19/5614* (2013.01); *G01C 19/5776* (2013.01)

(58) Field of Classification Search
CPC ..................... G01C 19/5614; G01C 19/5776
See application file for complete search history.

(56) References Cited

U.S. PATENT DOCUMENTS

| 5,269,192 A * | 12/1993 | Utsui ...................... G01L 3/105 |
| | | 73/862.333 |
| 2007/0041135 A1 | 2/2007 | Ito et al. |
| 2007/0261488 A1 | 11/2007 | Murashima |
| 2010/0060610 A1* | 3/2010 | Wu .......................... G06F 3/044 |
| | | 345/174 |
| 2010/0107760 A1 | 5/2010 | Murashima |
| 2012/0096942 A1 | 4/2012 | Hayashi et al. |
| 2013/0116544 A1* | 5/2013 | Rey ...................... A61B 5/7285 |
| | | 600/411 |

FOREIGN PATENT DOCUMENTS

| JP | 02271229 A | * 11/1990 |
| JP | 2000-321077 A | 11/2000 |

(Continued)

*Primary Examiner* — Paul West
(74) *Attorney, Agent, or Firm* — Harness, Dickey & Pierce, P.L.C.

(57) ABSTRACT

A detection device includes a driving circuit and a detection circuit. The detection circuit includes first and second electric charge-voltage conversion circuits to which first and second detection signals are input, first and second gain adjustment amplifiers that amplify output signals of the circuits, a switching mixer that has first and second input nodes to which the output signals of the first and second gain adjustment amplifiers are input, and performs differential synchronous detection thereon on the basis of a synchronization signal from the driving circuit, so as to output first and second output signals to first and second output nodes, first and second filters that receive the first and second output signals from the first and second output nodes of the switching mixer, and an A/D conversion circuit that receives output signals from the first and second filters so as to perform differential A/D conversion thereon.

18 Claims, 15 Drawing Sheets

(56) References Cited

FOREIGN PATENT DOCUMENTS

| | | | |
|---|---|---|---|
| JP | 2007-051930 A | 3/2007 |
| JP | 2007-057262 A | 3/2007 |
| JP | 2007-327944 A | 12/2007 |
| JP | 2007-327945 A | 12/2007 |
| JP | 2008-064663 A | 3/2008 |
| JP | 2012-044571 A | 3/2012 |
| JP | 2012-114571 A | 6/2012 |
| WO | WO-2010-150736 A1 | 12/2010 |

* cited by examiner

DETECTION DEVICE, SENSOR, ELECTRONIC APPARATUS, AND MOVING OBJECT

BACKGROUND

1. Technical Field

The present invention relates to a detection device, a sensor, an electronic apparatus, and a moving object.

2. Related Art

Gyro sensors for detecting physical quantities which vary depending on external factors are incorporated into electronic apparatuses such as a digital camera, a video camera, a mobile phone, and a car navigation system. The gyro sensors detect physical quantities such as angular velocity, and are used for so-called camera-shaking correction, posture control, GPS autonomous navigation, and the like.

As one of the gyro sensors, there is a vibration gyro sensor such as a quartz crystal piezoelectric vibration gyro sensor. In the vibration gyro sensor, a physical quantity corresponding to a Coriolis force caused by rotation is detected. As a detection device of such a vibration gyro sensor, for example, there is an analog synchronization detection type detection device or a direct sampling type detection device disclosed in JP-A-2007-327944.

In the analog synchronization detection type detection device, there is a problem in that a circuit scale becomes large or power consumption is considerable. In addition, in the detection device disclosed in JP-A-2007-327944, there is a problem in that offset adjustment or synchronous detection is performed not on differential signals but on a single-end signal, and thus removal of noise is insufficient.

In the direct sampling type detection device, a voltage output circuit such as a discrete Q/V conversion circuit is provided in the previous stage of an A/D conversion circuit, and a signal from the discrete Q/V conversion circuit is directly input to the A/D conversion circuit so as to undergo A/D conversion. Therefore, there is a problem in that there is no anti-aliasing filter in the previous stage of the A/D conversion circuit, and thus performance deterioration due to aliasing noise cannot be avoided.

SUMMARY

An advantage of some aspects of the invention is to provide a detection device, a sensor, an electronic apparatus, and a moving object capable of realizing a detection process at low noise while suppressing a large circuit scale.

An aspect of the invention is directed to a detection device including a driving circuit that drives a physical quantity transducer; and a detection circuit that receives a first detection signal and a second detection signal which are differential signals from the physical quantity transducer, and performs a detection process of detecting a signal corresponding to a physical quantity. The detection circuit includes a voltage output circuit that outputs a voltage corresponding to the first detection signal; a voltage output circuit that outputs a voltage corresponding to the second detection signal; a first gain adjustment amplifier that amplifies an output signal of the first voltage output circuit; a second gain adjustment amplifier that amplifies an output signal of the second voltage output circuit; a switching mixer that has a first input node to which the output signal of the first gain adjustment amplifier is input and a second input node to which the output signal of the second gain adjustment amplifier is input, performs synchronous detection on the output signal of the first gain adjustment amplifier and the output signal of the second gain adjustment amplifier on the basis of a synchronization signal from the driving circuit, outputs a first output signal of the first output signal and a second output signal to a first output node, and outputs the second output signal to a second output node; a first filter to which the first output signal from the first output node of the switching mixer is input; a second filter to which the second output signal from the second output node of the switching mixer is input; and an A/D conversion circuit that receives an output signal from the first filter and an output signal from the second filter and performs differential A/D conversion thereon.

In the aspect of the invention, the first and second detection signals from the physical quantity transducer are input to the first and second voltage output circuits, and the output signals of the first and second voltage output circuits are input to the first and second gain adjustment amplifiers so as to undergo gain adjustment. In addition, the output signals of the first and second gain adjustment amplifiers are input to the switching mixer so as to undergo differential synchronous detection. Thereafter, the first and second output signals of the switching mixer are subject to a filter process in the first and second filters, and are input to the A/D conversion circuit so as to undergo differential A/D conversion. According to the detection device with this configuration, the number of circuit blocks can be further reduced than in an analog synchronization detection type detection device, and it is possible to reduce and remove noise or the like occurring in the first and second voltage output circuits or the first and second gain adjustment amplifiers by frequency conversion in the switching mixer and filter characteristics of the first and second filters. Therefore, a detection process at low noise can be realized while suppressing a large circuit scale. In addition, the differential signals from the physical quantity transducer are subject to the gain adjustment, the synchronous detection process, and the filter process, in a differential signal state, and are input to the A/D conversion circuit so as to undergo the A/D conversion. Therefore, an advantageous configuration is provided in terms of noise reduction as compared with a circuit configuration in which the filter process, the synchronous detection process, the gain adjustment process, and the like are performed in a single-end signal state.

In the aspect of the invention, the first voltage output circuit may be a first electric charge-voltage conversion circuit which converts electric charge of the first detection signal into a voltage, and the second voltage output circuit may be a second electric charge-voltage conversion circuit which converts electric charge of the second detection signal into a voltage.

With this configuration, it is possible to reduce and remove noise or the like occurring in the first and second electric charge-voltage conversion circuits by frequency conversion in the switching mixer and filter characteristics of the first and second filters.

In the aspect of the invention, the first gain adjustment amplifier and the second gain adjustment amplifier may have frequency characteristics of a high-pass filter.

With this configuration, it is possible to reduce and remove an offset or noise occurring in the first and second electric charge-voltage conversion circuits by utilizing the frequency characteristics of the high-pass filters of the first and second gain adjustment amplifiers.

In the aspect of the invention, the first gain adjustment amplifier may have frequency characteristics of a high-pass filter which reduces 1/f noise of the first electric charge-voltage conversion circuit, and the second gain adjustment amplifier may have frequency characteristics of a high-pass filter which reduces 1/f noise of the second electric charge-voltage conversion circuit.

With this configuration, it is possible to reduce and remove 1/f noise of the first and second electric charge-voltage conversion circuits by the filter characteristics of the high-pass filters of the first and second gain adjustment amplifiers.

In the aspect of the invention, each of the first and second gain adjustment amplifiers may include an operational amplifier that has a first input terminal whose potential is fixed to a predetermined potential; a first capacitor that is provided between an input node and a node of a second input terminal of the operational amplifier; a second capacitor that is provided between an output node and the node of the second input terminal of the operational amplifier; and a resistive element that is provided between the output node and the node of the second input terminal of the operational amplifier.

With this configuration, it is possible to give the frequency characteristics of the high-pass filter to the first and second gain adjustment amplifiers by utilizing the capacitors and the resistive elements of the first and second gain adjustment amplifiers.

In the aspect of the invention, the first and second filters may be passive filters formed by passive elements.

With this configuration, the first and second output signals from the switching mixer can be input to the A/D conversion circuit via the passive first and second filters, and thus it is possible to improve the performance such as an S/N ratio.

In the aspect of the invention, the output signal from the first filter and the output signal from the second filter may be input to the A/D conversion circuit directly or only through passive elements.

With this configuration, there is no active element between the switching mixer and the A/D conversion circuit, and thus it is possible to improve the performance such as an S/N ratio.

In the aspect of the invention, the first filter may include a resistive element that is provided between the first output node of the switching mixer and a first connection node; and a capacitor that is provided between the first connection node and a node whose potential is fixed to a predetermined potential, and the second filter may include a resistive element that is provided between the second output node of the switching mixer and a second connection node; and a capacitor that is provided between the second connection node and a node whose potential is fixed to a predetermined potential.

With this configuration, the first and second filters can be formed by the capacitors and the resistive elements which are passive elements.

In the aspect of the invention, the switching mixer may include a first switching element that is provided between the first input node and the first output node; a second switching element that is provided between the first input node and the second output node; a third switching element that is provided between the second input node and the first output node; and a fourth switching element that is provided between the second input node and the second output node.

With this configuration, it is possible to perform synchronous detection on the output signals from the first and second gain adjustment amplifiers in a differential signal state by using the switching mixer formed by the first to fourth switching elements.

In the aspect of the invention, each of the first and second electric charge-voltage conversion circuits may include an operational amplifier that has a first input terminal whose potential is fixed to a predetermined potential; a capacitor that is provided between an output node and a node of a second input terminal of the operational amplifier; and a resistive element that is provided between the output node and the node of the second input terminal of the operational amplifier.

With this configuration, it is possible to convert detection electric charge from the physical quantity transducer into a voltage by using the continuous type first and second electric charge-voltage conversion circuits having the feedback resistive elements.

Another aspect of the invention is directed to a sensor including any of the detection devices described above; and the physical quantity transducer.

Still another aspect of the invention is directed to an electronic apparatus including any of the detection devices described above.

Yet another aspect of the invention is directed to a moving object including any of the detection devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The present embodiment described below does not improperly limit the content of the invention disclosed in the appended claims, and all the configurations described in the present embodiment cannot be said to be essential as solving means of the invention. For example, in the following, a description will be made of a case where a physical quantity transducer is a piezoelectric vibrator (vibration gyro) and a sensor is a gyro sensor as an example, but the invention is not limited thereto. For example, the invention is applicable to a capacitance detection type vibrator (vibration gyro) formed of a silicon substrate or the like, or a physical quantity transducer which detects a physical quantity equivalent to angular velocity information and physical quantities other than the angular velocity information or sensors or the like.

1. Electronic Apparatus and Gyro Sensor

Figure 1:
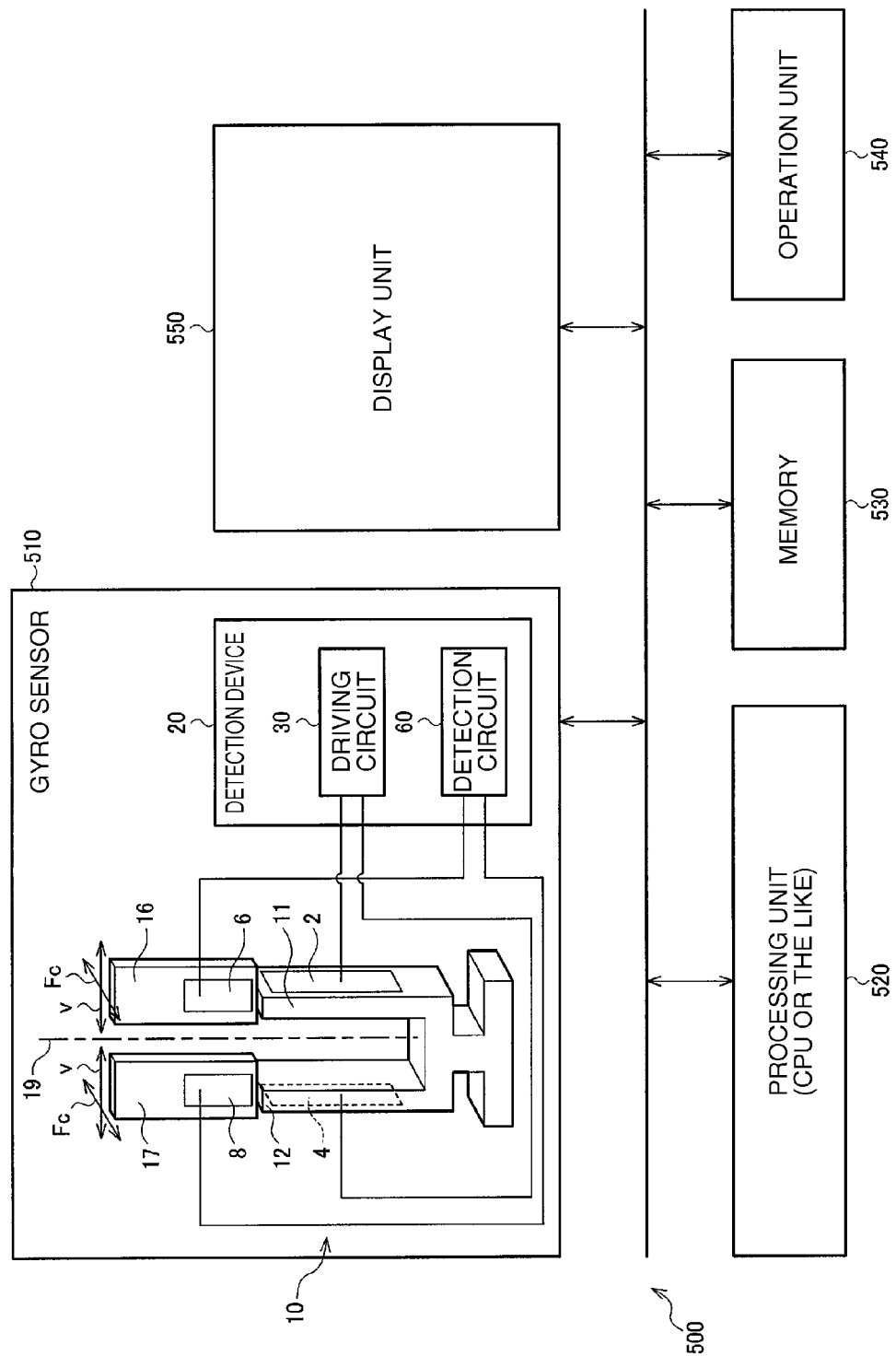
FIG. 1 is a diagram illustrating a configuration example of an electronic apparatus and a gyro sensor.

FIG. 1 illustrates a configuration example of a gyro sensor 510 (a sensor in a broad sense) including a detection device 20 of the present embodiment, and an electronic apparatus 500 including the gyro sensor 510. In addition, the electronic apparatus 500 and the gyro sensor 510 are not limited to the configuration of FIG. 1, and may have various modifications such as omission of some of constituent elements thereof, or addition of other constituent elements. As the electronic apparatus 500 of the present embodiment, various apparatuses such as a digital camera, a video camera, a mobile phone, a car navigation system, a robot, a game machine, a timepiece, a health apparatus, or a portable information terminal can be assumed.

The electronic apparatus 500 includes the gyro sensor 510 and a processing unit 520. In addition, a memory 530, an operation unit 540, and a display unit 550 may be included. The processing unit 520 (a CPU, an MPU, or the like) performs control of the gyro sensor 510 or the overall control of the electronic apparatus 500. In addition, the processing unit 520 performs a process on the basis of angular velocity information (a physical quantity in a broad sense) detected by the gyro sensor 510. For example, processes for camera-shaking correction, posture control, GPS autonomous navigation, and the like are performed on the basis of the angular velocity information. The memory 530 (a ROM, a RAM, or the like) stores a control program or a variety of data, or functions as a work area or a data storage area. The operation unit 540 is used for a user to operate the electronic apparatus 500, and the display unit 550 displays various information to the user.

The gyro sensor 510 includes a vibrator 10 and the detection device 20. The vibrator 10 (a physical quantity transducer in a broad sense) of FIG. 1 is a tuning folk type piezoelectric vibrator formed of a thin plate which is made of a piezoelectric material such as quartz crystal, and includes driving vibrators 11 and 12 and detection vibrators 16 and 17. The driving vibrators 11 and 12 are respectively provided with driving terminals 2 and 4, and the detection vibrators 16 and 17 are respectively provided with detection terminals 6 and 8.

A driving circuit 30 included in the detection device 20 outputs a driving signal (driving voltage) so as to drive the vibrator 10. In addition, the detection device 20 receives a feedback signal from the vibrator 10, and excites the vibrator 10 by using the feedback signal. A detection circuit 60 receives a detection signal (a detection current, or electric charge) from the vibrator 10 which is driven by the driving signal, and detects (extracts) a desired signal (Coriolis force signal) corresponding to a physical quantity applied to the vibrator 10, from the detection signal.

Specifically, an AC driving signal (driving voltage) from the driving circuit 30 is applied to the driving terminal 2 of the driving vibrator 11. Then, the driving vibrator 11 starts vibration due to an inverse voltage effect, and the driving vibrator 12 also starts vibration due to tuning folk vibration. At this time, a current (electric charge) caused by a piezoelectric effect of the driving vibrator 12 is fed back to the driving circuit 30 as a feedback signal from the driving terminal 4. Accordingly, an oscillation loop including the vibrator 10 is formed.

If the driving vibrators 11 and 12 vibrate, the detection vibrators 16 and 17 vibrate at vibration velocity v in the directions illustrated in FIG. 1. Therefore, the current (electric charge) caused by the piezoelectric effect of the detection vibrators 16 and 17 is output from the detection terminals 6 and 8 as detection signals (first and second detection signals). As a result, the detection circuit 60 receives the detection signals from the vibrator 10 and detects a desired signal (desired wave) which is a signal corresponding to a Coriolis force. In other words, when the vibrator 10 (gyro sensor) rotates with respect to a detection axis 19, a Coriolis force Fc occurs in a direction perpendicular to the vibration direction of the vibration velocity v. For example, if the angular velocity during rotation with respect to the detection axis 19 is set to $\omega$, the mass of the vibrator is set to m, and the vibration velocity of the vibrator is set to v, the Coriolis force is indicated by Fc=2mv$\omega$. Therefore, the detection circuit 60 detects a desired signal which is a signal corresponding to the Coriolis force, so as to obtain a rotation angular velocity $\omega$ of the gyro sensor. In addition, by using the obtained angular velocity $\omega$, the processing unit 520 can perform various processes such as camera-shaking correction, posture control, or GPS autonomous navigation.

FIG. 1 illustrates an example of a case where the vibrator 10 is of a tuning folk type, but the vibrator 10 of the present embodiment is not limited to this structure. For example, a T type or a double T type may be used. In addition, materials other than quartz crystal may be used as a piezoelectric material of the vibrator 10.

2. Detection Device

Figure 2:
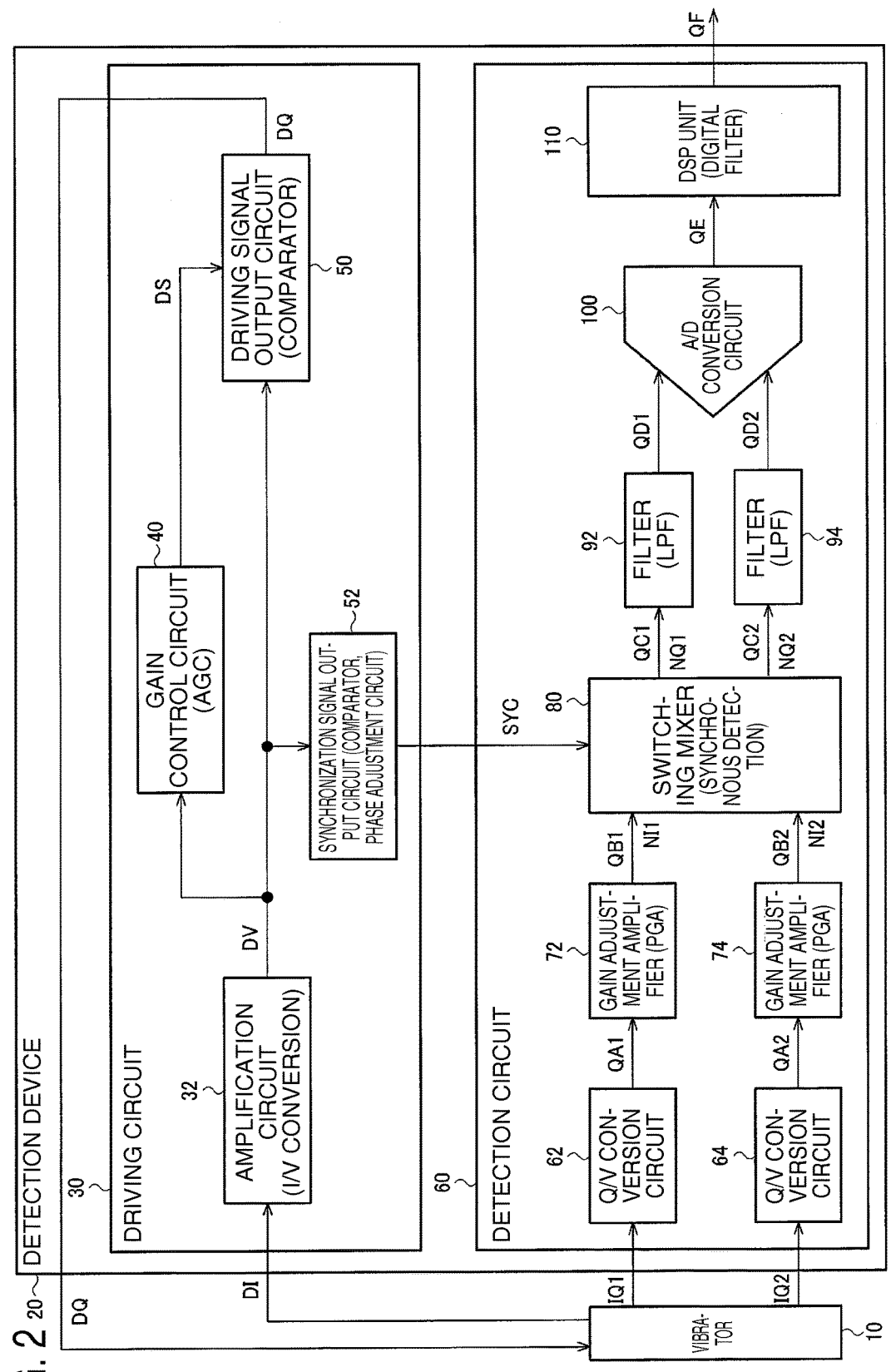
FIG. 2 is a diagram illustrating a configuration example of a detection device.

FIG. 2 illustrates a configuration example of the detection device 20 of the present embodiment. The detection device 20 includes the driving circuit 30 which drives the vibrator 10 (physical quantity transducer), and the detection circuit 60 which receives the first and second detection signals IQ1 and IQ2 from the vibrator 10 and performs a detection process of detecting a desired signal.

The driving circuit 30 includes an amplification circuit 32 to which a signal DI from the vibrator 10 is input; a gain control circuit 40 (automatic gain control: AGC) which performs automatic gain control; a driving signal output circuit 50 which outputs a driving signal DQ to the vibrator 10; and a synchronization signal output circuit 52 which outputs a synchronization signal SYC to the detection circuit 60. In addition, a configuration of the driving circuit 30 is not limited to FIG. 2, and may have various modifications such as omission of some of constituent elements thereof, or addition of other constituent elements.

The amplification circuit 32 (I/V conversion circuit) converts the current signal DI from the vibrator 10 into a voltage signal DV for outputting. The amplification circuit 32 is implemented using a capacitor, a resistive element, an operational amplifier, and the like.

The gain control circuit 40 (AGC) monitors the signal DV, and controls again of the oscillation loop. Specifically, a control voltage DS for controlling a gain of the oscillation loop is output to the driving signal output circuit 50. For example, in the driving circuit 30, in order to maintain sensitivity of the gyro sensor to be constant, it is necessary to maintain an amplitude of a driving voltage supplied to the vibrator 10 (driving vibrator) to be constant. For this reason, the gain control circuit 40 which automatically adjusts a gain is provided in the oscillation loop of the driving vibration system. The gain control circuit 40 variably automatically adjusts a gain so that an amplitude (the vibration velocity v of the vibrator) of the signal DI which is fed back from the vibrator 10 is maintained to be constant. In addition, when vibration starts, a gain of the oscillation loop is set to a gain greater than 1, in order to make high-speed vibration start possible. The gain control circuit 40 may include a full-wave rectifying circuit for converting the AC signal DV from the amplification circuit 32 into a DC signal, an integrator which outputs a control voltage DS corresponding to a difference between the DC signal voltage from the full-wave rectifying circuit and a reference voltage, and the like.

The driving signal output circuit 50 receives the signal DV from the amplification circuit 32 so as to output a driving signal DQ to the vibrator 10. Specifically, the driving signal output circuit 50 outputs the driving signal DQ with an amplitude corresponding to the control voltage DS from the gain control circuit 40. For example, a rectangular wave driving signal is output. The driving signal output circuit 50 may be implemented using a comparator and the like.

The synchronization signal output circuit 52 receives the signal DV from the amplification circuit 32 so as to output the synchronization signal SYC (reference signal) to the detection circuit 60. The synchronization signal output circuit 52 may be implemented using a comparator which binarizes the sinusoidal (AC) signal DV so as to generate the rectangular wave synchronization signal SYC, a phase adjustment circuit (phase shifter) which adjusts a phase of the synchronization signal SYC, and the like.

The detection circuit 60 includes first and second Q/V conversion circuits 62 and 64, first and second gain adjustment amplifiers 72 and 74, a switching mixer 80, first and second filters 92 and 94, an A/D conversion circuit 100, and a DSP unit 110 (digital signal processing unit). In addition, a configuration of the detection circuit 60 is not limited to the configuration of FIG. 2, and may have various modifications such as omission of some (for example, the DSP unit) of constituent elements thereof, or addition of other constituent elements.

The first and second detection signals IQ1 and IQ2 which are differential signals from the vibrator 10 are input to the Q/V conversion circuits 62 and 64 (electric charge-voltage conversion circuits) as voltage output circuits. In addition, the Q/V conversion circuits 62 and 64 convert electric charge (current) generated in the vibrator 10 into voltages. The Q/V conversion circuits 62 and 64 are continuous type electric charge-voltage conversion circuits having feedback resistors.

The gain adjustment amplifiers 72 and 74 adjust gains of the output signals QA1 and QA2 of the Q/V conversion circuits 62 and 64 so as to amplify the signals. The gain adjustment amplifiers 72 and 74 are so-called programmable gain amplifiers, and amplifies the signals QA1 and QA2 with gains set by a control circuit (not illustrated). For example, the amplification to a signal having an amplitude suitable for a voltage conversion range of the A/D conversion circuit 100 is performed.

The switching mixer 80 is a mixer which performs differential synchronous detection on the basis of the synchronization signal SYC from the driving circuit 30. Specifically, in the switching mixer 80, an output signal QB1 of the gain adjustment amplifier 72 is input to a first input node NI1, and an output signal QB2 of the gain adjustment amplifier 74 is input to a second input node NI2. In addition, the differential synchronous detection is performed using the synchronization signal SYC from the driving circuit 30, and differential first and second output signals QC1 and QC2 are respectively to output to first and second output nodes NQ1 and NQ2. In the switching mixer 80, an unnecessary signal such as noise (1/f noise) generated by the previous-stage circuits (the Q/V conversion circuits and the gain adjustment amplifiers) is frequency-converted to have a high frequency band. In addition, a desired signal which is a signal corresponding to the Coriolis force is dropped down to a DC signal.

The first output signal QC1 from the first output node NQ1 of the switching mixer 80 is input to the filter 92. The second output signal QC2 from the second output node NQ2 of the switching mixer 80 is input to the filter 94. The filters 92 and 94 are, for example, low-pass filters having frequency characteristics which remove (attenuate) an unnecessary signal and allow a desired signal to pass therethrough. For example, the unnecessary signal such as 1/f noise which has been converted to have a high frequency band by the switching mixer 80 is removed by the filters 92 and 94. In addition, the filters 92 and 94 are passive filters formed by, for example, passive elements. In other words, passive filters formed by passive elements such as resistive elements or capacitors without using operational amplifiers may be employed as the filters 92 and 94.

The A/D conversion circuit 100 receives an output signal QD1 from the filter 92 and an output signal QD2 from the filter 94 so as to perform differential A/D conversion. Specifically, the A/D conversion circuit 100 performs the A/D conversion by sampling the output signals QD1 and QD2 with the filters 92 and 94 as anti-aliasing filters (prefilters). In addition, in the present embodiment, the output signal QD1 from the filter 92 and the output signal QD2 from the filter 94 are input to the A/D conversion circuit 100 without using active elements.

As the A/D conversion circuit 100, A/D conversion circuits of various types such as, for example, a delta-sigma type or a successive comparison type can be employed. In a case where of employing the delta-sigma type, an A/D conversion circuit may be used which has, for example, a correlated double sampling (CDS) or chopper function for reducing 1/f noise, and is formed by, for example, a second-order delta-sigma modulator, or the like. In addition, in a case of employing a successive comparison type, an A/D conversion circuit may be used which has, for example, a dynamic element matching (DEM) function or the like for suppressing deterioration in an S/N ratio due to DAC element variations, and is formed by capacitance DACs and successive comparison control logics.

The digital signal processing (DSP) unit 110 performs various digital signal processes. For example, the DSP unit 110 performs, for example, a digital filter process for limiting a band based on an application of a desired signal, or a digital filter process for removing noise generated by the A/D conversion circuit 100 or the like. In addition, digital correction processes such as gain correction (sensitivity adjustment) and offset correction are performed.

The above-described detection device of the present embodiment employs a full differential switching mixer type. In other words, the differential detection signals IQ1 and IQ2 from the vibrator 10 undergo signal amplification and gain adjustment in the Q/V conversion circuits 62 and 64, and the gain adjustment amplifiers 72 and 74, and are input to the switching mixer 80 as the differential signals QB1 and QB2. The switching mixer 80 performs the synchronous detection process on the differential signals QB1 and QB2 so that an unnecessary signal is frequency-converted to have a high frequency band. In addition, the unnecessary signal which is frequency-converted to have a high frequency band is removed by the filters 92 and 94, and the differential signals QD1 and QD2 are input to the A/D conversion circuit 100 so as to undergo differential A/D conversion.

According to the full differential switching mixer type detection device, the 1/f noise or the like generated in the Q/V conversion circuits 62 and 64 and the gain adjustment amplifiers 72 and 74 is removed by the frequency conversion in the switching mixer 80 and the low-pass filter characteristics of the filters 92 and 94. In addition, the switching mixer 80 which cannot earn a gain but does not generates 1/f noise and the filters 92 and 94 which are formed by low-noise passive elements are provided between the gain adjustment amplifiers 72 and 74 and the A/D conversion circuit 100. Therefore, the noise generated by the Q/V conversion circuits 62 and 64 or the gain adjustment amplifiers 72 and 74 is removed, and noise generated by the switching mixer 80 or the filters 92 and 94 is minimized, and thus the signals QD1 and QD2 in a low noise state are input to the A/D conversion circuit 100 and undergo A/D conversion. Further, the signals QD1 and QD2 can be A/D converted as differential signals, and thus it is possible to further improve an S/N ratio than in a case of A/D conversion as a single-end signal.

Figure 3:
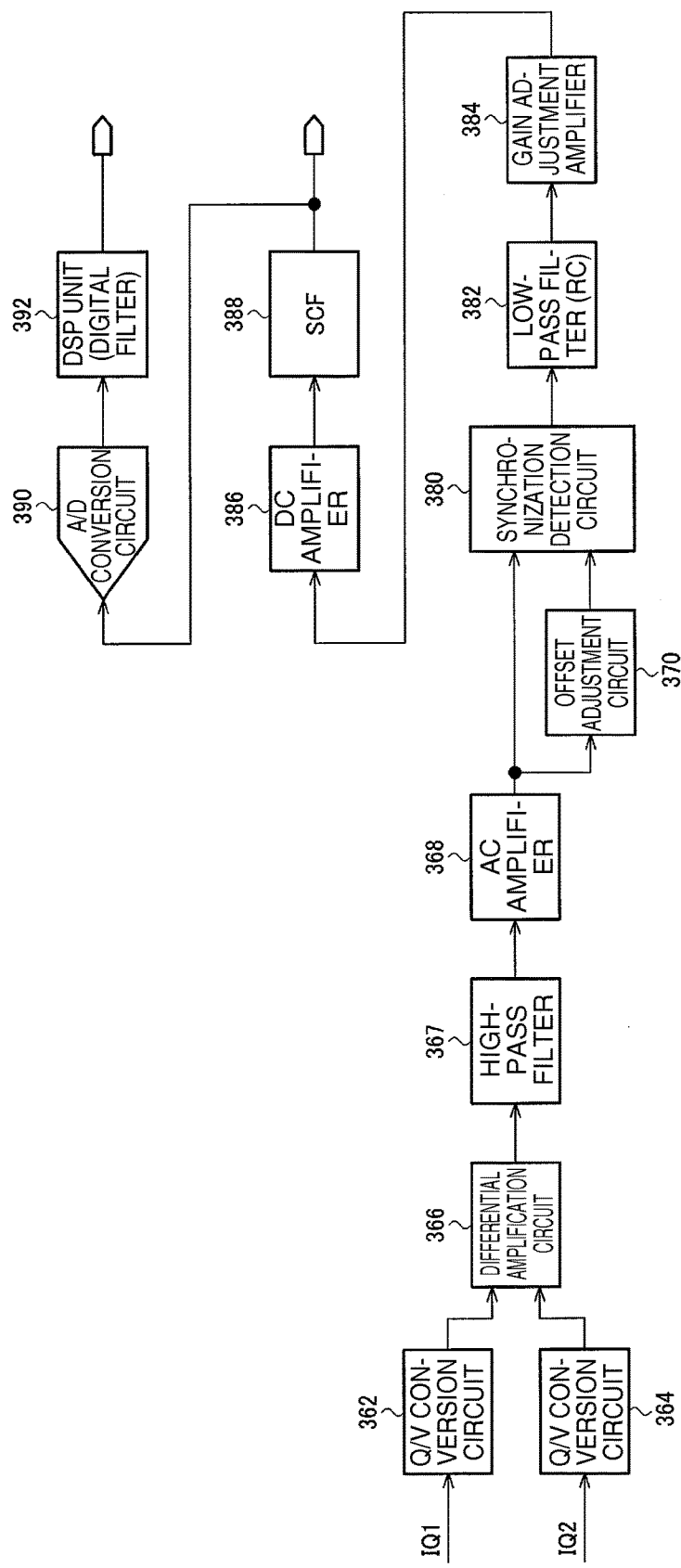
FIG. 3 is a diagram illustrating a configuration example of a first comparative example of an analog synchronization detection type.

For example, FIG. 3 illustrates a configuration example of an analog synchronization detection type detection device as a first comparative example of the present embodiment. The detection device of the first comparative example includes Q/V conversion circuits 362 and 364, a differential amplification circuit 366, a high-pass filter 367, an AC amplifier 368, an offset adjustment circuit 370, a synchronous detection circuit 380, a low-pass filter 382, a gain adjustment amplifier 384, a DC amplifier 386, and an SCF 388 (switched capacitor filter). In addition, for example, an A/D conversion circuit 390 and a DSP unit 392 (digital filter) which are externally attached to the detection device are provided.

In the first example of the analog synchronous detection type of FIG. 3, the number of circuit blocks increases as compared with the detection device of the present embodiment of FIG. 2, and thus the circuits have a large scale. In addition, there are many analog circuit blocks which consume a large amount of current, which leads to wasteful power consumption, and thus power consumption is excessive. Particularly, if the function of the A/D conversion circuit 390 or the DSP unit 392 is to be built in the detection device, a large circuit scale or an increase in power consumption is much more problematic.

In addition, in the first comparative example of the analog synchronization detection type, an analog voltage is output as its specification, and thus design concept of a circuit is that a gain of a signal is set to be as large as possible in order to easily treat the signal. Further, a high power supply voltage is required to obtain such a large gain, and thus an increase in power consumption is much more problematic.

In the first comparative example, the differential signals from the Q/V conversion circuits 362 and 364 are changed to a single-end signal by the differential amplification circuit 366 of differential input and single-end output. In addition, subsequent filter process, synchronous detection process, gain adjustment process, and the like are performed on the single-end signal, and thus this is disadvantageous in terms of noise reduction.

In contrast, in the detection device of the invention of FIG. 2, the number of circuit blocks is considerably smaller than in the first comparative example of FIG. 3, and it is possible to easily achieve a small circuit scale or reduce power consumption. In addition, noise generated by the Q/V conversion circuits 62 and 64 or the gain adjustment amplifiers 72 and 74 can be removed by the frequency conversion in the switching mixer 80 and the low-pass filter characteristics of the filters 92 and 94. Further, an amount of noise generated by the switching mixer 80 or the filters 92 and 94 is also small. Therefore, since the A/D conversion can be performed in a low noise signal state, there is an advantage in that the detection process can be performed at low noise while realizing a small circuit scale or low power consumption.

In the present embodiment, the gain adjustment in the gain adjustment amplifiers 72 and 74 is aimed at amplification to a signal having an amplitude suitable for a voltage conversion range of the A/D conversion circuit 100. In other words, the gain adjustment in the gain adjustment amplifiers 72 and 74 is aimed not at adjusting sensitivity or the like but at maximizing an S/N ratio for noise occurring in the A/D conversion circuit 100. Therefore, according to the present embodiment, it is possible to solve the problem of the first comparative example in which a high power supply voltage is required to obtain a large gain, and thus it becomes easier to achieve a low power supply voltage. As a result, it is possible to realize lower power consumption.

In the present embodiment, the differential signals IQ1 and IQ2 from the vibrator 10 are subject to the gain adjustment, the synchronous detection process, and the filter process, in a differential signal state, and are input to the A/D conversion circuit 100 so as to undergo the A/D conversion. For this reason, the present embodiment provides an advantageous configuration in terms of noise reduction as compared with the first comparative example in which the filter process, the synchronous detection process, the gain adjustment process, and the like are performed in a single-end signal state.

For example, in the first comparative example of FIG. 3, a first signal with a single end from the AC amplifier 368 is inverted using an inverting amplifier at the previous stage of the synchronous detection circuit 380, thereby generating a second signal, and synchronous detection is performed using the first and second signals. For this reason, noise of the first signal is not equivalent to noise of the second signal, and, even if frequency conversion is performed in the synchronous detection circuit 380, noise or the like of the inverting amplifier remains. For this reason, an S/N ratio further deteriorates than in the switching mixer 80 of the present embodiment which performs synchronous detection in a differential signal state. In the present embodiment using the differential switching mixer 80, such remaining noise or the like of the inverting amplifier does not occur, and thus it is possible to further improve an S/N ratio than in the first comparative example of FIG. 3.

Figure 4:
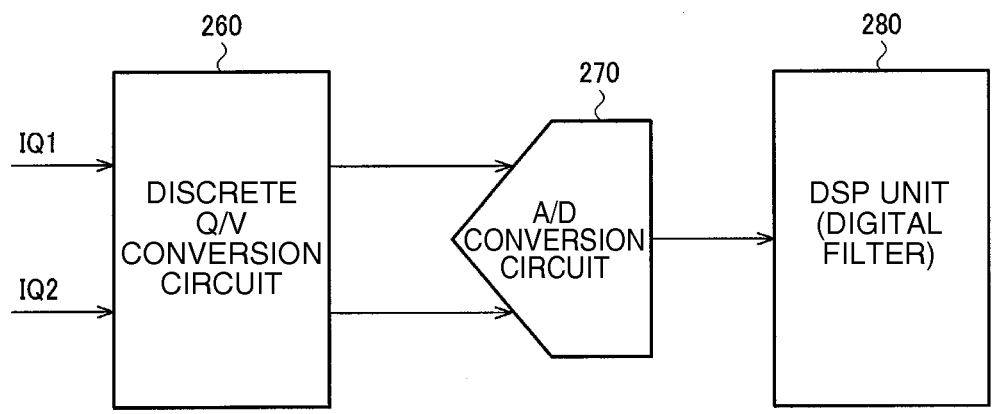
FIG. 4 is a configuration example of a second comparative example of a direct sampling type.

FIG. 4 illustrates a configuration example of a direct sampling type detection device as a second comparative example of the invention. The detection device of the second comparative example includes a discrete Q/V conversion circuit 260, an A/D conversion circuit 270, and a DSP unit 280. The direct sampling type provides a superior configuration from the viewpoint of achieving a small circuit scale. However, there is a problem in that there is no anti-aliasing filter in the previous stage of the A/D conversion circuit 270, and thus performance deterioration due to aliasing noise cannot be avoided. In addition, there is a problem in that, if current consumption is increased for achieving low noise in the discrete Q/V conversion circuit 260, a frequency band is expanded, which results in an increase in aliasing noise, and thus it is hard to achieve low noise. In addition, in a case of the discrete Q/V conversion circuit 260, there is also a problem in that deterioration in noise characteristics due to a parasitic capacitor taking up the input terminal thereof is notable. Further, a circuit configuration thereof is that the discrete Q/V conversion circuit 260 and the A/D conversion circuit 270 are integrally operated, and thus is not suitable for a multi-axis gyro sensor, for example, and there is a problem in that processes and configurations of logical circuits of the subsequent stage are complex.

In contrast, in the detection device in the present embodiment of FIG. 2, the Q/V conversion circuits 62 and 64 are continuous type electric charge-voltage conversion circuits having feedback resistive elements. Therefore, it is possible to prevent the performance deterioration problem due to the aliasing noise, occurring in the direct sampling method, and thus there is an advantage in which the detection process can be performed at low noise with a small-scale circuit configuration. In addition, the detection device of the present embodiment has a superior configuration in that it is possible to easily handle a multi-axis gyro sensor, and to simplify processes and configurations of logical circuits of the subsequent stage.

3. Specific Configuration of Detection Circuit

Figure 5:
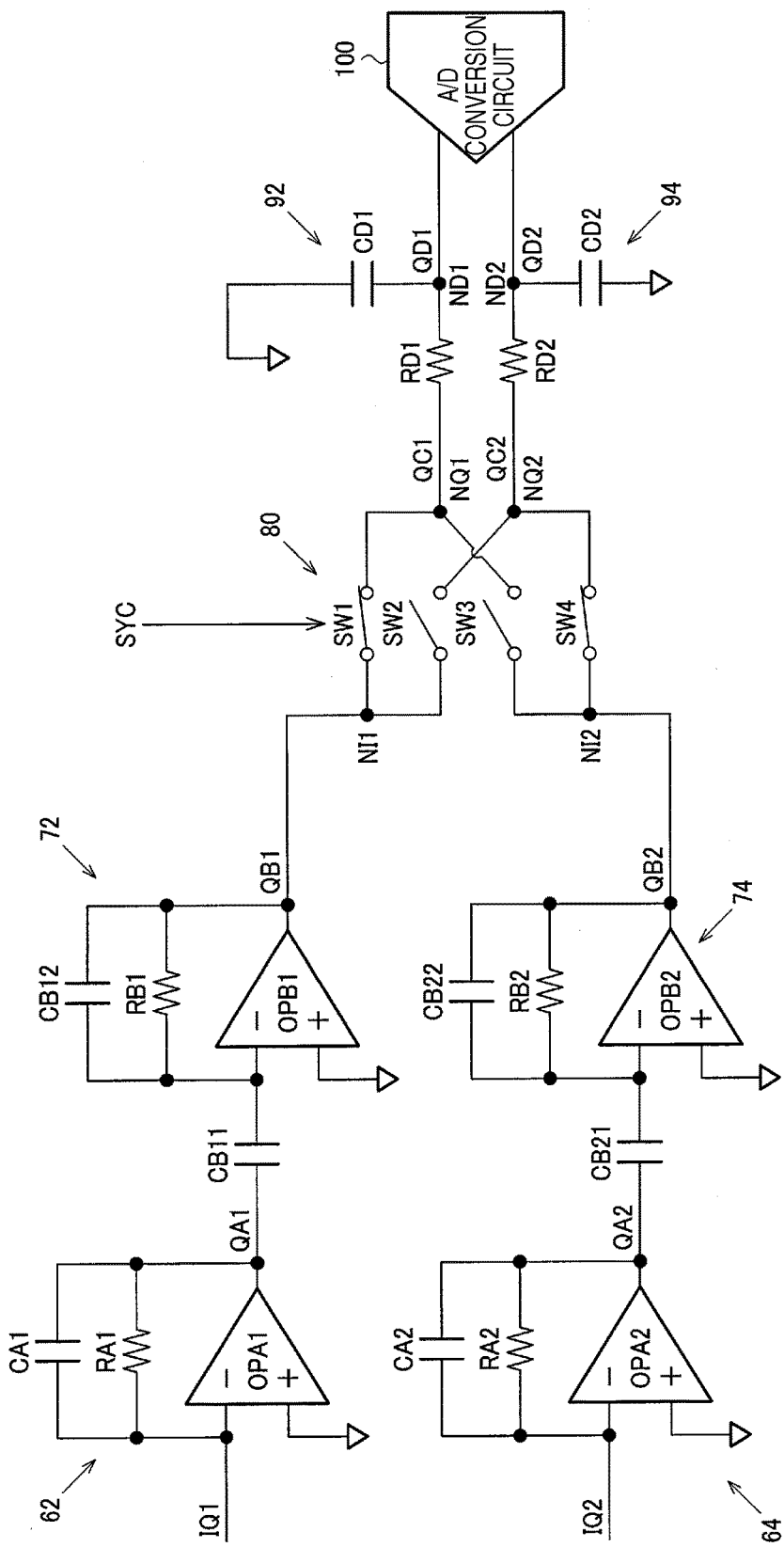
FIG. 5 is a diagram illustrating a specific first configuration example of the detection circuit of the present embodiment.

FIG. 5 illustrates a specific first configuration example of the detection circuit 60 of the present embodiment.

The Q/V conversion circuit 62 includes an operational amplifier OPA1, a capacitor CA1, and a resistive element RA1, and the Q/V conversion circuit 64 includes an operational amplifier OPA2, a capacitor CA2, and a resistive element RA2.

The operational amplifier OPA1 of the Q/V conversion circuit 62 has a non-inverting input terminal (a first input terminal in a broad sense) to which a fixed potential is applied. Specifically, the operational amplifier OPA1 of the Q/V conversion circuit 62 has the non-inverting input terminal which is set to a predetermined potential (AGND). The capacitor CA1 and the resistive element RA1 are provided between an output node of the Q/V conversion circuit 62 and a node of an inverting input terminal (a second input terminal in a broad sense) of the operational amplifier OPA1.

The operational amplifier OPA2 of the Q/V conversion circuit 64 has a non-inverting input terminal to which a fixed potential is applied. Specifically, the operational amplifier OPA2 of the Q/V conversion circuit 64 has the non-inverting input terminal which is set to a predetermined potential. The capacitor CA2 and the resistive element RA2 are provided between an output node of the Q/V conversion circuit 64 and a node of an inverting input terminal of the operational amplifier OPA2.

In this way, the Q/V conversion circuits 62 and 64 of the present embodiment are continuous type electric charge-voltage conversion circuits having the feedback resistive elements RA1 and RA2, and have an advantageous configuration in terms of noise reduction as compared with the direct sampling type discrete Q/V conversion circuit 260 of FIG. 4.

The gain adjustment amplifier 72 includes an operational amplifier OPB1, first and second capacitors CB11 and CB12, and a resistive element RB1. The gain adjustment amplifier 74 includes an operational amplifier OPB2, first and second capacitors CB21 and CB22, and a resistive element RB2.

The operational amplifier OPB1 of the gain adjustment amplifier 72 has a non-inverting input terminal (a first input terminal) which is set to a predetermined potential (AGND). The capacitor CB11 is provided between an input node of the gain adjustment amplifier 72 and a node of an inverting input terminal (a second input terminal) of the operational amplifier OPB1. The capacitor CB12 and the resistive element RB1 are provided between an output node of the gain adjustment amplifier 72 and the node of the inverting input terminal of the operational amplifier OPB1.

The operational amplifier OPB2 of the gain adjustment amplifier 74 has a non-inverting input terminal which is set to a predetermined potential. The capacitor CB21 is provided between an input node of the gain adjustment amplifier 74 and a node of an inverting input terminal of the operational amplifier OPB2. The capacitor CB22 and the resistive element RB2 are provided between an output node of the gain adjustment amplifier 74 and the node of the inverting input terminal of the operational amplifier OPB2.

In the gain adjustment amplifier 72, at least one of the capacitors CB11 and CB12 is a capacitor whose capacitance value is variable. Also in the gain adjustment amplifier 74, at least one of the capacitors CB21 and CB22 is a capacitor whose capacitance value is variable. Capacitance values of the capacitors are set to be variable by a control circuit (register) (not illustrated). In addition, for example, when a capacitance value of the capacitors CB11 and CB21 is C1, and a capacitance value of the capacitors CB12 and CB22 is C2, gains of the gain adjustment amplifiers 72 and 74 are set by a capacitance ratio C2/C1 of C1 and C2.

The gain adjustment amplifiers 72 and 74 of FIG. 5 have frequency characteristics of a high-pass filter. In other words, a high-pass filter is formed by the capacitor CB11 and the resistive element RB1 of the gain adjustment amplifier 72, and a high-pass filter is formed by the capacitor CB21 and the resistive element RB2 of the gain adjustment amplifier 74. Accordingly, the gain adjustment amplifier 72 has frequency characteristics of the high-pass filter which reduces (removes) 1/f noise of the Q/V conversion circuit 62. In addition, the gain adjustment amplifier 74 has frequency characteristics of the high-pass filter which reduces (removes) 1/f noise of the Q/V conversion circuit 64.

The switching mixer 80 includes first to fourth switching elements SW1, SW2, SW3 and SW4. The switching element SW1 is provided between a first input node NI1 and a first output node NQ1 of the switching mixer 80. The switching element SW2 is provided between the first input node NI1 and a second output node NQ2 of the switching mixer 80. The switching element SW3 is provided between a second input node NI2 and the first output node NQ1 of the switching mixer 80. The switching element SW4 is provided between the second input node NI2 and the second output node NQ2 of the switching mixer 80. The switching elements SW1 to SW4 may be formed by, for example, MOS transistors (for example, NMOS type transistors or transfer gates).

In addition, on the basis of the synchronization signal SYC from the driving circuit 30, the switching elements SW1 and SW2 are exclusively turned on and off, and the switching elements SW3 and SW4 are exclusively turned on and off. For example, if the synchronization signal SYC is in an H level (first level), the switching elements SW1 and SW4 are turned on, and the switching elements SW2 and SW3 are turned off. On the other hand, if the synchronization signal SYC is in an L level (second level), the switching elements SW2 and SW3 are turned on, and the switching elements SW1 and SW4 are turned off. Accordingly, the differential signals QB1 and QB2 from the gain adjustment amplifiers 72 and 74 are synchronously detected in a differential signal state, and the synchronously detected signals are output as the differential signals QC1 and QC2. For example, in the first comparative example of FIG. 3, the synchronous detection is performed in a single-end signal state, and thus a single-end signal is output, but, in the present embodiment, the synchronous detection is performed in a differential signal state, and thus differential signals are output as synchronously detected signals.

The filter 92 has a resistive element RD1 and a capacitor CD1. The filter 94 has a resistive element RD2 and a capacitor CD2.

The resistive element RD1 of the filter 92 is provided between the output node NQ1 of the switching mixer 80 and a first connection node ND1. The first connection node ND1 is a node connected to the first input node of the A/D conversion circuit 100. The capacitor CD1 is provided between the first connection node ND1 and a node whose potential is fixed to a predetermined potential (for example, AGND).

The resistive element RD2 of the filter 94 is provided between the output node NQ2 of the switching mixer 80 and a second connection node ND2. The second connection node ND2 is a node connected to the second input node of the A/D conversion circuit 100. The capacitor CD2 is provided between the second connection node ND2 and a node whose potential is fixed to a predetermined potential (for example, AGND).

As mentioned above, the filters 92 and 94 of FIG. 5 are passive filters formed by passive elements such as resistive elements and capacitors. In addition, the output signal QD1 from the filter 92 and the output signal QD2 from the filter 94 are directly input to the A/D conversion circuit 100 without using active elements. The output signal QD2 may be input to the A/D conversion circuit 100 only via a passive element.

Figure 6:
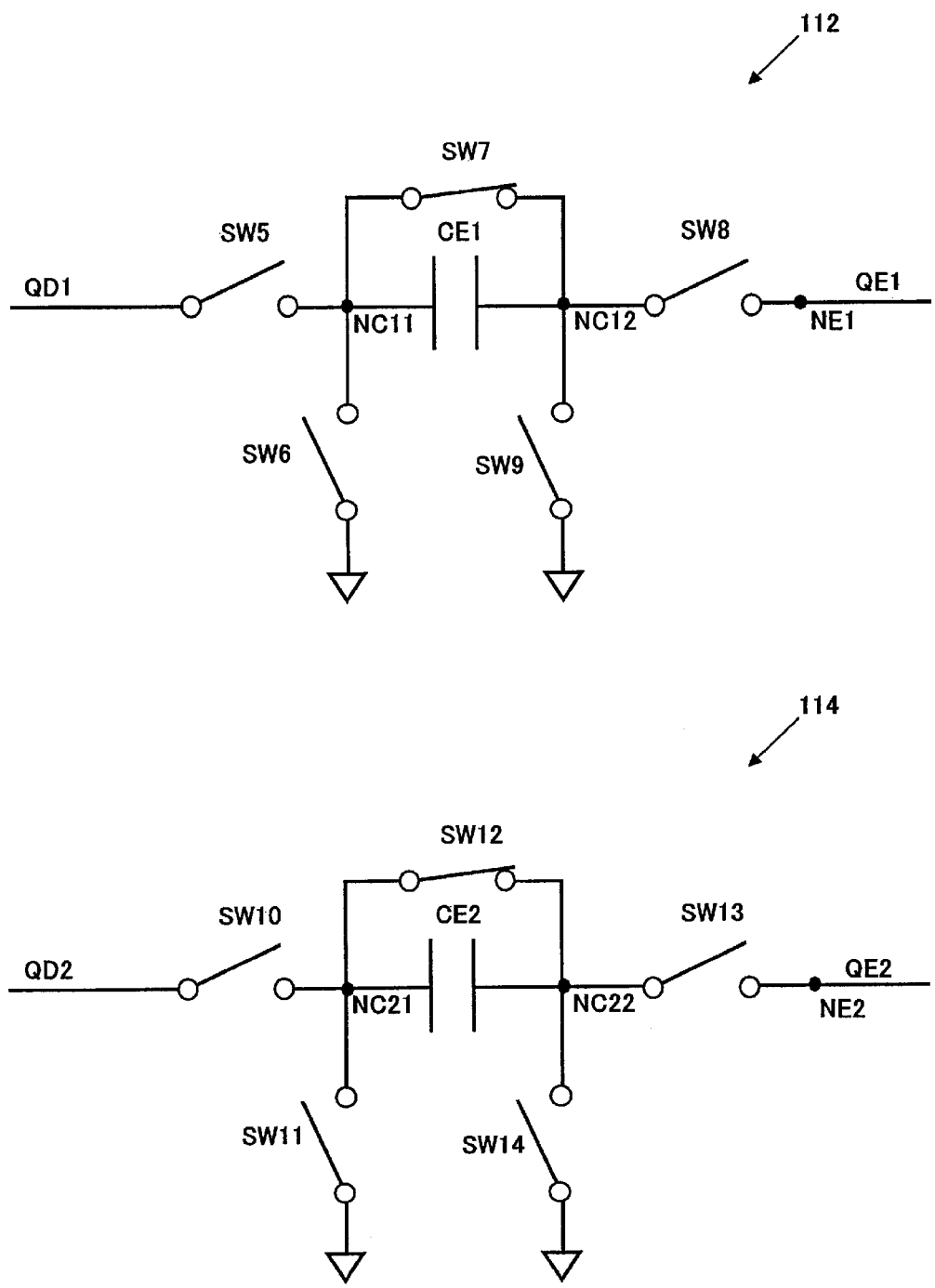
FIG. 6 is a diagram illustrating a configuration example of a sampler circuit of the present embodiment.

FIG. 6 illustrates first and second sampler circuits 112 and 114 provided in the A/D conversion circuit 100.

The first sampler circuit 112 includes a capacitor CE1, and switching elements SW5, SW6, SW7, SW8 and SW9. The switching element SW5 is provided between the first connection node ND1 illustrated in FIG. 5 and a node NC11 of one end of the capacitor CE1. The switching element SW6 is provided between the node NC11 of one end of the capacitor CE1 and a node whose potential is fixed to a predetermined potential (for example, AGND). The switching element SW7 is provided between the node NC11 of one end of the capacitor CE1 and a node NC12 of the other end of the capacitor CE1. The switching element SW8 is provided between the node NC12 of the other end of the capacitor CE1 and a node NE1 of an output signal QE1 of the sampler circuit 112. The switching element SW9 is provided between the node NC12 of the other end of the capacitor CE1 and a node whose potential is fixed to a predetermined potential (for example, AGND).

The second sampler circuit 114 includes a capacitor CE2, and switching elements SW10, SW11, SW12, SW13 and SW14. The switching element SW10 is provided between the second connection node ND2 illustrated in FIG. 5 and a node NC21 of one end of the capacitor CE2. The switching element SW11 is provided between the node NC21 of one end of the capacitor CE2 and a node whose potential is fixed to a predetermined potential (for example, AGND). The switching element SW12 is provided between the node NC21 of one end of the capacitor CE2 and a node NC22 of the other end of the capacitor CE2. The switching element SW13 is provided between the node NC22 of the other end of the capacitor CE2 and a node NE2 of an output signal QE2 of the sampler circuit 114. The switching element SW14 is provided between the node NC22 of the other end of the capacitor CE2 and a node whose potential is fixed to a predetermined potential (for example, AGND).

Figure 7:
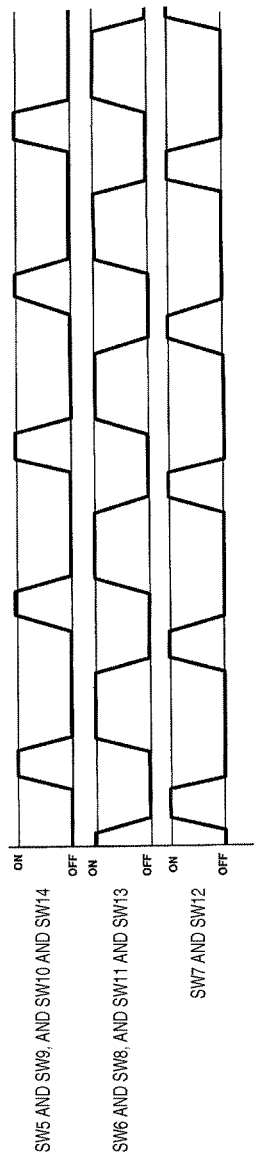
FIG. 7 is a timing chart of switching elements of the sampler circuit of the present embodiment.

FIG. 7 illustrates a timing chart of On and Off timings of the switching elements SW5, SW6, SW7, SW8 and SW9 of the sampler circuit 112 and the switching elements SW10, SW11, SW12, SW13 and SW14 of the sampler circuit 114. First, a timing chart of the respective switching elements of the sampler circuit 112 will be described. During a period when the switching element SW7 is turned on, the node NC11 is connected to the node NC12, and thus electric charge accumulated in the capacitor CE1 is removed. Then, the switching elements SW5 and SW9 are turned on, and the switching elements SW6, SW7 and SW8 are turned off, so that electric charge corresponding to the signal QD1 input to the sampler circuit 112 is accumulated in the capacitor CE1. Next, the switching elements SW6 and SW8 are turned on, and the other switching elements SW5, SW9 and SW7 are turned off, so that the node NC12 is connected to a circuit (not illustrated) inside the A/D conversion circuit 100 in a subsequent stage. Thus, the sampler circuit 112 outputs the output signal QE1.

Subsequently, a timing chart of the respective switching elements of the sampler circuit 114 will be described. During a period when the switching element SW12 is turned on, the node NC21 is connected to the node NC22, and thus electric charge accumulated in the capacitor CE2 is removed. Then, the switching elements SW10 and SW14 are turned on, and the switching elements SW11, SW12 and SW13 are turned off, so that electric charge corresponding to the signal QD2 input to the sampler circuit 114 is accumulated in the capacitor CE2. Next, the switching elements SW11 and SW13 are turned on, and the other switching elements SW10, SW14 and SW12 are turned off, so that the node NC22 is connected to a subsequent-stage circuit (not illustrated) inside the A/D conversion circuit 100. Thus, the sampler circuit 114 outputs the output signal QE2.

Next, a sampling process is performed in a subsequent-stage circuit (not illustrated) inside the A/D conversion circuit 100 by using the output signal QE1 of the sampler circuit 112 and the output signal QE2 of the sampler circuit 114.

Figure 8:
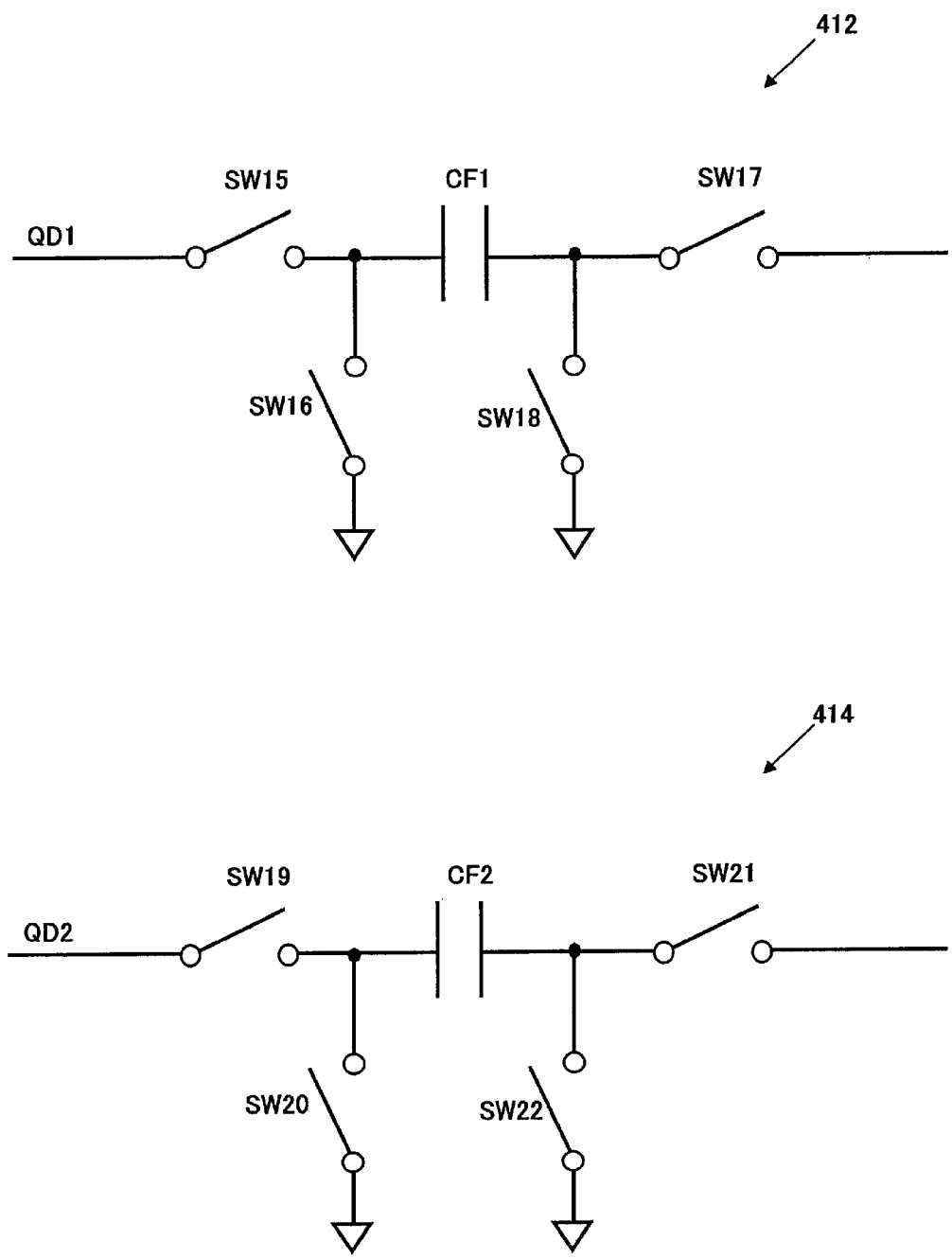
FIG. 8 is a diagram illustrating a sampler circuit of a comparative example.
Figure 9:
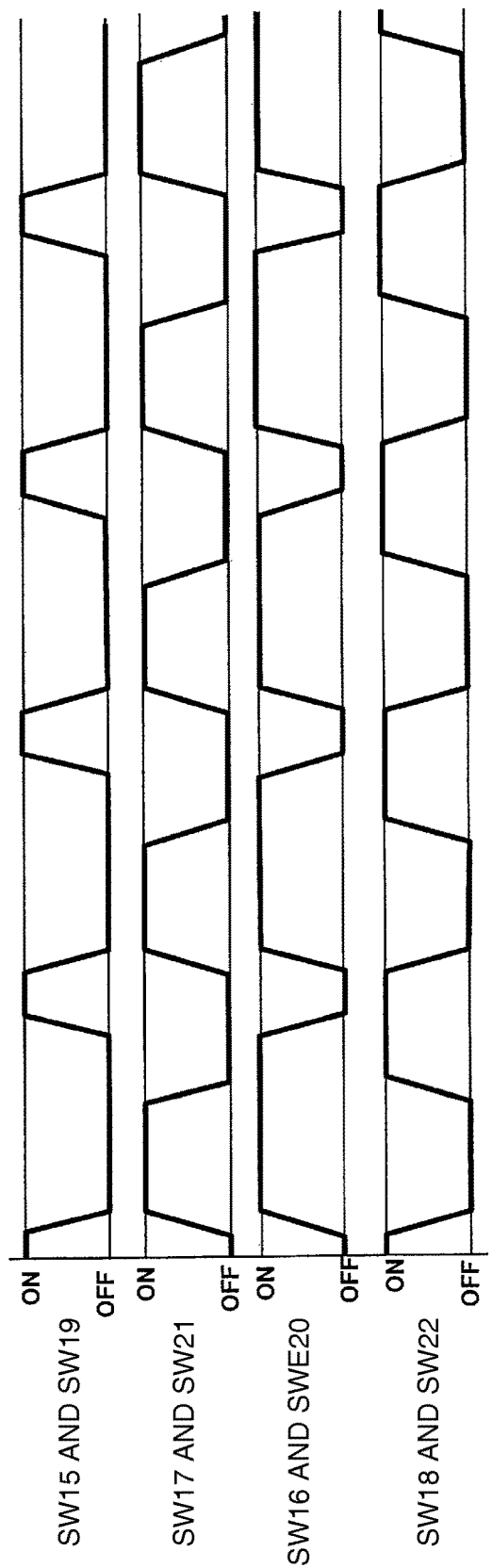
FIG. 9 is a timing chart of switching elements of the sampler circuit of the comparative example.

Effects achieved by the sampler circuits 112 and 114 will be described using a comparative example. FIG. 8 illustrates sampler circuits 412 and 414 as a comparative example, and FIG. 9 illustrates a timing chart of On and Off timings of switching elements SW15 to SW21 of the sampler circuits. In a case where signals input to the sampler circuits 412 and 414 are voltage signals which have been driven by an operational amplifier, an amount of electric charge accumulated in the capacitors CF1 and CF2 is uniquely determined by the operational amplifier. However, as described in FIG. 5, in a case where signals input to the A/D conversion circuit 100 (sampler circuits 412 and 414) are the signals QD1 and QD2 which are input via the passive filters (filters 92 and 94), the signals have not been driven, and thus electric charge remaining in the capacitors CF1 and CF2 is uncertain. The uncertain electric charge has influence on the sampling process in the A/D conversion circuit, and thus accuracy of an output result of the A/D conversion circuit cannot be increased in the sampler circuits 412 and 414 of the comparative example.

On the other hand, according to the sampler circuits 112 and 114 described in FIGS. 6 and 7, before the internal circuit of the A/D conversion circuit 100, located in the subsequent stage of the sampler circuits 112 and 114, performs a sampling process, the switching elements SW7 and SW12 are connected, thereby removing electric charge remaining in the capacitors CE1 and CE2. Therefore, the electric charge remaining in the capacitors CE1 and CE2 has no influence on the sampling process, and thus it is possible to increase accuracy of an output of the A/D conversion process in the A/D conversion circuit 100.

Figure 10:
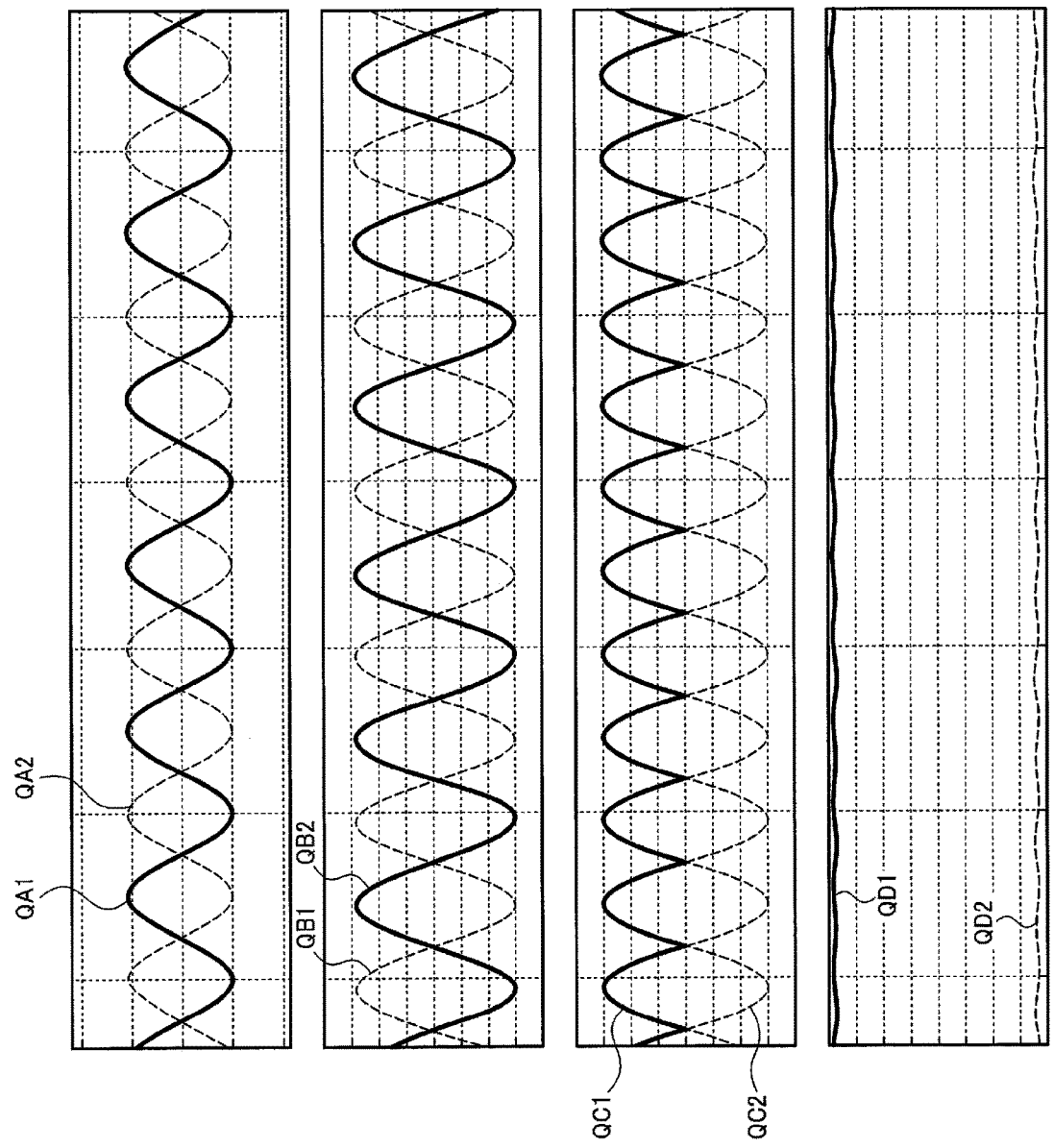
FIG. 10 is a diagram illustrating a signal waveform example of each signal of the detection circuit.

FIG. 10 illustrates signal waveform examples of the various signals QA1 and QA2, QB1 and QB2, QC1 and QC2, and QD1 and QD2 of the detection circuit of FIG. 5.

As illustrated in FIG. 10, the signals QA1 and QA2 output from the Q/V conversion circuits 62 and 64 are inversely amplified by the gain adjustment amplifiers 72 and 74 so as to be output as the signals QB1 and QB2. Specifically, the amplification is performed using the above-described gain set by the capacitance ratio C2/C1.

The QB1 and QB2 output from the gain adjustment amplifiers 72 and 74 are synchronously detected by the switching mixer 80, so as to be output as the signals QC1 and QC2. Due to the synchronous detection, an unnecessary signal such as 1/f noise is frequency-converted to have a high frequency band. In addition, the filters 92 and 94 perform a low-pass filter process on the signals QC1 and QC2, so as to generate the signals QD1 and QD2. The signals QD1 and QD2 from which the unnecessary signal converted to have a high frequency band is removed through the low-pass filter process are signals having low noise. Further, the signals QD1 and QD2 having low noise are input to the A/D conversion circuit 100 as differential signals, and undergo differential A/D conversion.

Figure 11:
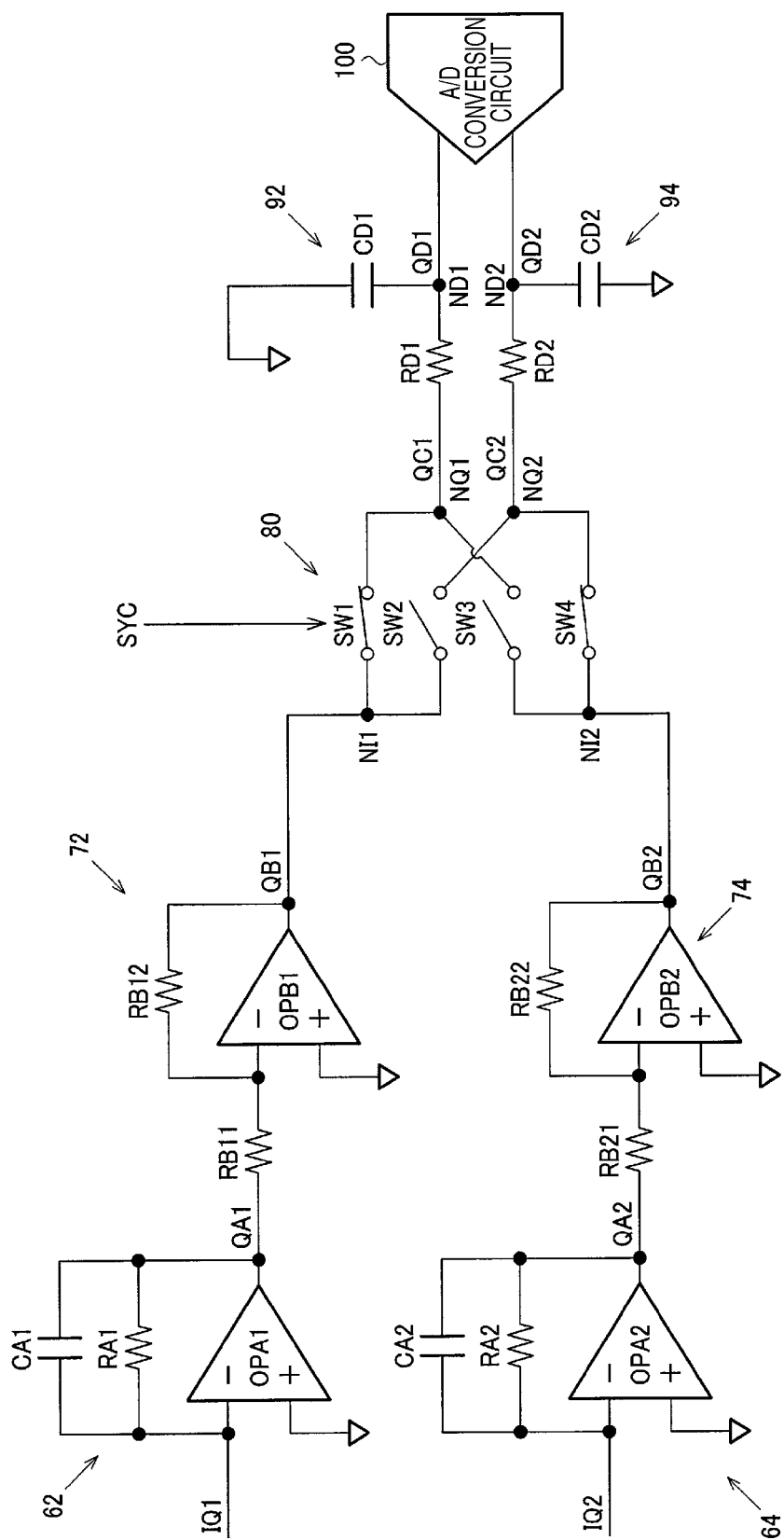
FIG. 11 is a diagram illustrating a specific second configuration example of the detection circuit of the present embodiment.

FIG. 11 illustrates a specific second configuration example of the detection device of the present embodiment.

As described above, in the first configuration example of FIG. 5, the gain adjustment amplifier 72 includes the capacitors CB11 and CB12, the resistive element RB1, and the operational amplifier OPB1. This is also the same for the gain adjustment amplifier 74. In addition, a gain is set by a capacitance ratio. Further, the gain adjustment amplifiers 72 and 74 have frequency characteristics of a high-pass filter.

In contrast, in the second configuration example of FIG. 11, the gain adjustment amplifier 72 includes resistive elements RB11 and RB12, and an operational amplifier OPB1. This is also the same for the gain adjustment amplifier 74. In addition, a gain is set to a resistance ratio. Further, the gain adjustment amplifiers 72 and 74 do not have frequency characteristics of a high-pass filter.

Figure 12:
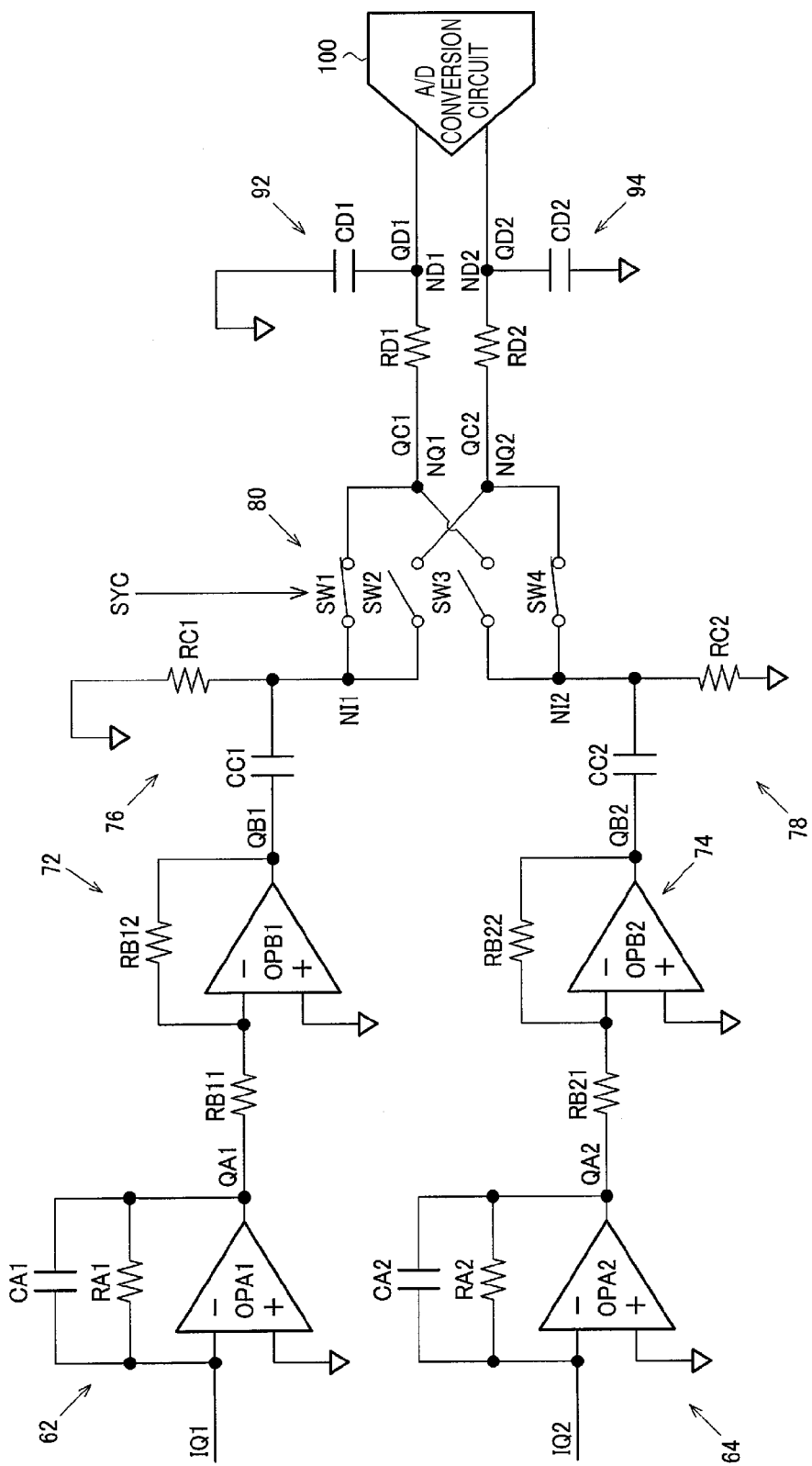
FIG. 12 is a diagram illustrating a specific third configuration example of the detection circuit of the present embodiment.

FIG. 12 illustrates a third configuration example of the detection device of the present embodiment. In the third configuration example, a high-pass filter 76 formed by a capacitor CC1 and a resistive element RC1 is added to the subsequent stage of the gain adjustment amplifier 72 with respect to the second configuration example of FIG. 11. Similarly, a high-pass filter 78 formed by a capacitor CC2 and a resistive element RC2 is added to the subsequent stage of the gain adjustment amplifier 74.

Figure 13A:
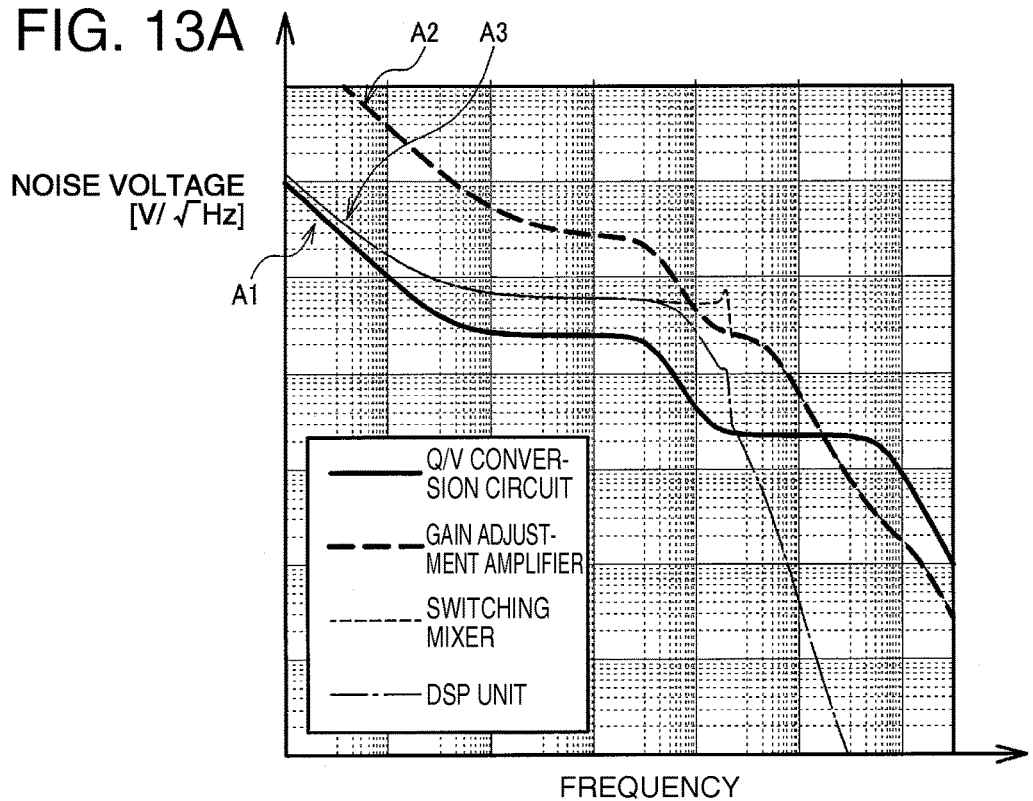
FIGS. 13A and 13B are diagrams illustrating frequency characteristics of noise voltages.

FIG. 13A is a diagram illustrating frequency characteristics of a noise voltage in the second configuration example of FIG. 11. As indicated by A1, high 1/f noise occurs in a low frequency band in the outputs of the Q/V conversion circuits 62 and 64. The 1/f noise of A1 is increased as indicated by A2 due to the signal amplification in the gain adjustment amplifiers 72 and 74. The 1/f noise is reduced due to the frequency conversion in the switching mixer 80 and the low-pass filter characteristics of the filters 92 and 94, but an extent of reduction is not sufficient as indicated by A3. For example, if a clock duty of the switching mixer 80 is deviated from 50%, the 1/f noise leaks, which thus leads to deterioration in noise performance.

Figure 13B:
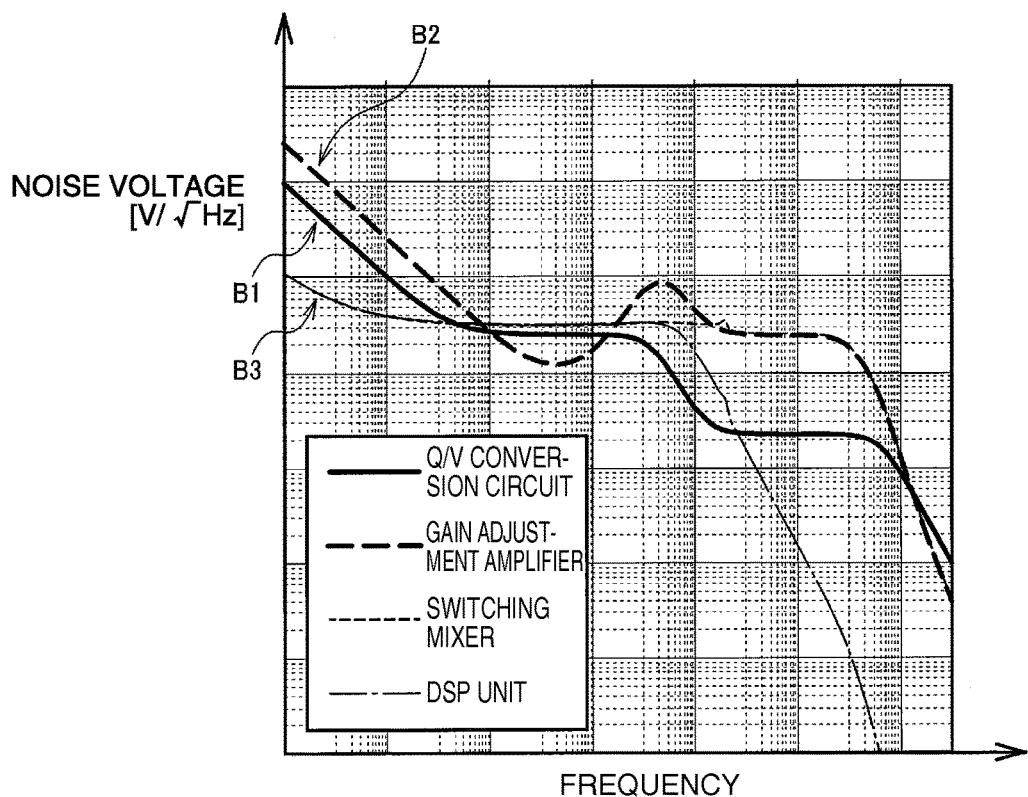

FIG. 13B is a diagram illustrating frequency characteristics of a noise voltage in the first configuration example of FIG. 5. As indicated by B1, high 1/f noise occurs in a low frequency band in the outputs of the Q/V conversion circuits 62 and 64. The 1/f noise of B1 is more considerably reduced as indicated by B2 than in a case of A2 of FIG. 13A due to the high-pass filter characteristics of the gain adjustment amplifiers 72 and 74. The 1/f noise is more sufficiently reduced as indicated by B3 than in a case of A3 of FIG. 13A due to the frequency conversion in the switching mixer 80 and the low-pass filter characteristics of the filters 92 and 94. For example, even if a clock duty of the switching mixer 80 is deviated from 50%, leakage of the 1/f noise can be minimized. Therefore, the A/D conversion circuit 100 can perform A/D conversion on a signal in which the 1/f noise or the like is sufficiently reduced, and a detection process at low noise can be realized while suppressing a large circuit scale or an increase in power consumption.

In the second configuration example of FIG. 11, the offset in the Q/V conversion circuits 62 and 64 is amplified by the gain adjustment amplifiers 72 and 74. For this reason, the offset has a different value in accordance with the gain set by the gain adjustment amplifiers 72 and 74 when viewed from the circuits of the subsequent stage (the A/D conversion circuit and the DSP unit). For example, if a case where an offset is adjusted by the circuits of the subsequent stage such as the DSP unit 110 is considered, the offset is preferably adjusted by one-time inspection. However, in the second configuration example of FIG. 11, there is a problem in that the offset is required to be adjusted for each gain set by the gain adjustment amplifiers 72 and 74, and thus the process is complex.

In order to solve this problem, as in the third configuration example of FIG. 12, the high-pass filters 76 and 78 may be considered to be provided in the subsequent stages of the gain adjustment amplifiers 72 and 74. However, in the third configuration example, the anti-aliasing filters 92 and 94 of the previous stage of the A/D conversion circuit 100 are passive circuits, the switching mixer 80 is a circuit which does not have a driving circuit such as an operational amplifier, and the high-pass filters 76 and 78 are also passive circuits. Therefore, there is a problem in that the third configuration example is weak to disturbance, and there are worries about information transmission of a signal.

In relation to this factor, in the first configuration example of FIG. 5, the offset of the Q/V conversion circuits 62 and 64 is removed by the high-pass filter characteristics of the gain adjustment amplifiers 72 and 74. Therefore, when viewed from the circuits of the subsequent stage such as the DSP unit 110, only an offset of the gain adjustment amplifiers 72 and 74 is observed regardless of gain settings of the gain adjustment amplifiers 72 and 74. In addition, the offset is not required to be adjusted for each gain set by the gain adjustment amplifiers 72 and 74, and thus the process can be simplified. In addition, as described above, the 1/f noise of the Q/V conversion circuits 62 and 64 is removed by the high-pass filter characteristics of the gain adjustment amplifiers 72 and 74, and the 1/f noise of the gain adjustment amplifiers 72 and 74 is removed by the frequency conversion in the switching mixer 80 and the low-pass filter characteristics of the filters 92 and 94. Therefore, the input stage of the A/D conversion circuit 100 has a configuration in which the 1/f noise occurring in an active circuit is not observed, and thus has an optimal configuration as a circuit configuration of a detection circuit in which noise in a low frequency band is considered to be important.

4. Specific Configuration of Driving Circuit

Figure 14:
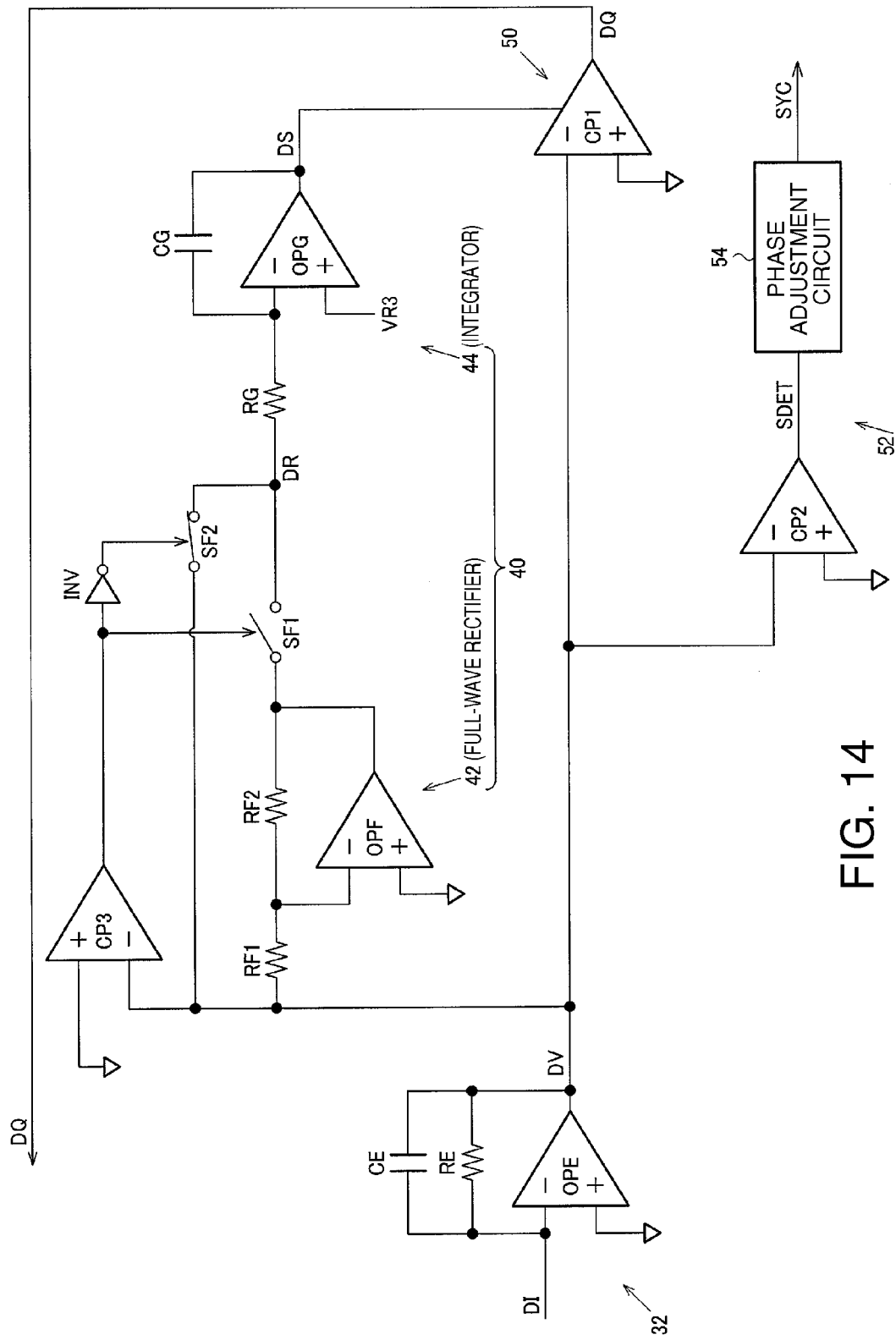
FIG. 14 is a diagram illustrating a specific configuration example of a driving circuit.

FIG. 14 is a diagram illustrating a specific configuration example of the driving circuit 30 of the present embodiment.

The amplification circuit 32 is an integral current-voltage conversion circuit having a low-pass filter characteristic, and includes an operational amplifier OPE, a capacitor CE, and a resistive element RE. A non-inverting input terminal (first input terminal) of the operational amplifier OPE is set to a predetermined potential (for example, AGND), and the signal DI from the vibrator 10 is input to an inverting input terminal (second input terminal). The capacitor CE and the resistive element RE are provided between an output node of the amplification circuit 32 and a node of the inverting input terminal of the operational amplifier OPE.

The gain control circuit 40 (AGC) is a circuit which automatically adjusts a gain so that the loop gain is 1 in an oscillation steady state, and includes a full-wave rectifier 42 and an integrator 44. In addition, the gain control circuit 40 may include an oscillation detector which detects an oscillation state.

The full-wave rectifier 42 is a circuit which full-wave rectifies the output signal DV of the amplification circuit 32, and includes an operational amplifier OPF, resistive elements RF1 and RF2, a comparator CP3, switching elements SF1 and SF2, and an inverter circuit INV.

The resistive element RF1 is provided between the node of the signal DV and a node of an inverting input terminal of the operational amplifier OPF, and the resistive element RF2 is provided between an output node of the operational amplifier OPF and the node of the inverting input terminal thereof.

The switching element SF1 is provided between the output node of the operational amplifier OPF and an input node of the integrator 44, and the switching element SF2 is provided between the node of the signal DV and the input node of the integrator 44. In addition, the switching elements SF1 and SF2 are controlled so as to be exclusively turned on or off on the basis of an output signal of the comparator CP3 which compares a voltage of the signal DV with a voltage of a predetermined potential. Accordingly, a signal DR is obtained by full-wave rectifying the signal DV.

The integrator 44 is a circuit which performs an integral process on the signal DR which is full-wave rectified by the full-wave rectifier 42, and includes an operational amplifier OPG, a resistive element RG, and a capacitor CG. A non-inverting input terminal of the operational amplifier OPG is set to a predetermined voltage VR3. The resistive element RG is provided between the input node of the integrator 44 and a node of an inverting input terminal of the operational amplifier OPG, and the capacitor CG is provided between an output node of the operational amplifier OPG and a node of the inverting input terminal thereof. An output signal of the integrator 44 which is an output signal of the gain control circuit 40 is the control voltage DS, and is supplied to a comparator CP1 of the driving signal output circuit 50.

The comparator CP1 forming the driving signal output circuit 50 has a non-inverting input terminal which is set to a predetermined potential (for example, AGND), and an inverting input terminal to which the signal DV from the amplification circuit 32 is input. In addition, the rectangular wave driving signal DQ obtained by binarizing the signal DV is output. Even if the rectangular wave driving signal DQ is output to the vibrator 10, wasteful harmonic waves are reduced by a frequency filter operation of the vibrator 10, and thus a driving signal of an aimed frequency (resonance frequency) can be obtained. The comparator CP1 includes a differential portion and an output portion connected to the differential portion. Further, the control voltage DS from the gain control circuit 40 (integrator) is supplied as a power supply voltage (a high potential side power supply voltage) of the output portion of the comparator CP1. Accordingly, an amplitude of the driving signal DQ output from the comparator CP1 is changed in response to the control voltage DS of the gain control circuit 40, and thus gain control is realized so that the loop gain is 1 in the oscillation steady state. Furthermore, the driving signal output circuit 50 may be a circuit which outputs a sinusoidal driving signal DQ instead of the rectangular wave driving signal.

The synchronization signal output circuit 52 includes a comparator CP2 and a phase adjustment circuit 54 (phase shifter). The comparator CP2 has a non-inverting input terminal which is set to a predetermined potential (for example, AGND) and an inverting input terminal to which the signal DV from the amplification circuit 32 is input. In addition, a signal SDET obtained by binarizing the signal DV is output. The phase adjustment circuit 54 adjusts a phase of the signal SDET so that synchronous detection in a switching mixer 80 is appropriately performed, and outputs the signal SDET to the switching mixer 80 of the detection circuit 60 as the synchronization signal SYC.

In addition, a configuration of the driving circuit 30 is not limited to the configuration of FIG. 14, and may have various modifications. For example, in FIG. 14, the driving signal output circuit 50 is formed by the comparator CP1 which outputs the rectangular wave driving signal DQ, but the driving signal output circuit 50 may be formed by a gain amplifier which outputs a sinusoidal driving signal DQ. In this case, an amplitude of the driving signal DQ may be controlled by controlling a gain of the gain amplifier on the basis of the control voltage DS from the gain control circuit 40. Further, in FIG. 14, the comparator CP1 of the driving signal output circuit 50 and the comparator CP2 of the synchronization signal output circuit 52 are illustrated as separate circuits, but are not limited thereto. For example, a composite comparator may be used in which the comparators CP1 and CP2 share a differential portion thereof.

Figure 15:
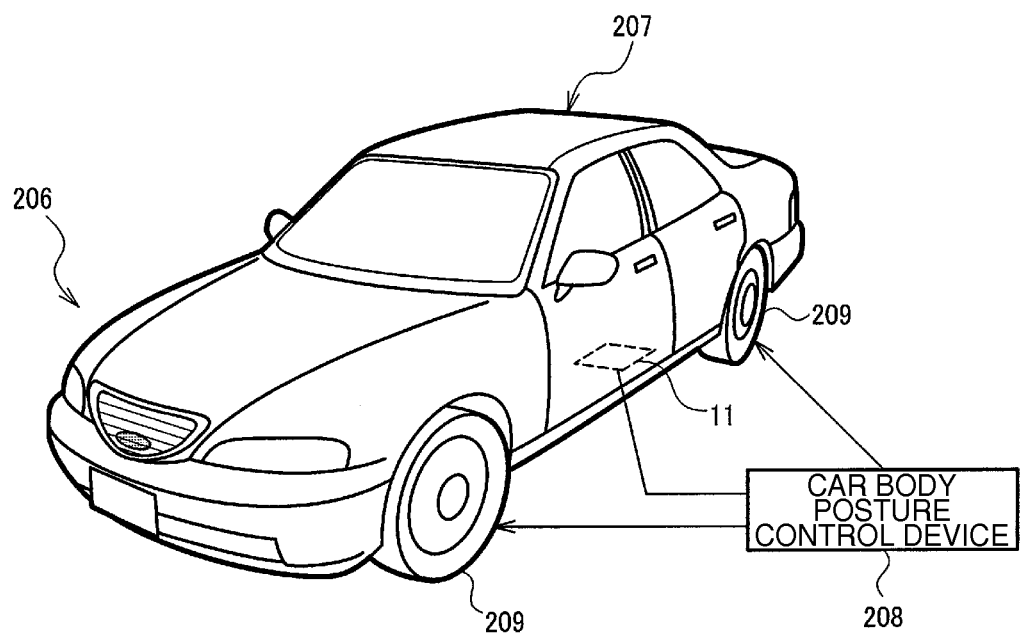
FIG. 15 is a conceptual diagram schematically illustrating a configuration of an automobile as a specific example of a moving object.

In addition, the gyro sensor 510 (sensor) of the present embodiment may be incorporated into various moving objects such as a car, an aircraft, a motorbike, a bicycle, and a ship. The moving objects are equipment or instruments which are provided with, for example, driving mechanisms such as engines or motors, steering mechanisms such as handles or rudders, and various electronic apparatuses, and move on the ground, in the air, and on the sea. FIG. 15 schematically illustrates an automobile 206 as a specific example of the moving object. The gyro sensor 510 including the vibrator 10 and the detection device 20 is incorporated into the automobile 206. The gyro sensor 510 can detect a posture of a car body 207. A detection signal of the gyro sensor 510 may be supplied to a car body posture control device 208. The car body posture control device 208 may control hardness and softness of a suspension or a brake of each car wheel 209, for example, in accordance with a posture of the car body 207. In addition, such posture control may be used in various moving objects such as a bipedal walking robot, an airplane, and a helicopter. In order to perform posture control, the gyro sensor 510 may be incorporated thereinto.

Although the present embodiment has been described as above, it can be easily understood by a person skilled in the art that various modifications without substantially departing from the new matters and effects of the invention are possible. Therefore, these modifications are all included in the scope of the invention. For example, in the specification or the drawings, the terminologies (the gyro sensor, the vibrator, the angular velocity information, the non-inverting input terminal, the inverting input terminal, and the like) which are mentioned at least once along with different terminologies (the sensor, the physical quantity transducer, the physical quantity, the first input terminal, and the second input terminal, and the like) which have broader senses or the same meanings may be replaced with the different terminologies in any location of the specification or the drawings. In addition, a configuration of the detection circuit, the sensor, or the electronic apparatus, and a structure or the like of the vibrator are not also limited to the above description, and may have various modifications.

The entire disclosure of Japanese Patent Application No. 2013-060875, filed Mar. 22, 2013 is expressly incorporated by reference herein.

What is claimed is:

1. A detection device comprising:
    a driving circuit that drives a physical quantity transducer; and
    a detection circuit that receives a first detection signal and a second detection signal which are differential signals from the physical quantity transducer, and performs a detection process of detecting a signal corresponding to a physical quantity,
    wherein the detection circuit includes:
        a first voltage output circuit that outputs a voltage corresponding to the first detection signal;
        a second voltage output circuit that outputs a voltage corresponding to the second detection signal;
        a first gain adjustment amplifier that amplifies an output signal of the first voltage output circuit;
        a second gain adjustment amplifier that amplifies an output signal of the second voltage output circuit;
        a switching mixer that has a first input node to which the output signal of the first gain adjustment amplifier is input and a second input node to which the output signal of the second gain adjustment amplifier is input, performs synchronous detection on the output signal of the first gain adjustment amplifier and the output signal of the second gain adjustment amplifier on the basis of a synchronization signal from the driving circuit, outputs a first output signal to a first output node, and outputs a second output signal to a second output node;
        a first filter to which the first output signal from the first output node of the switching mixer is input;
        a second filter to which the second output signal from the second output node of the switching mixer is input; and
        an A/D conversion circuit that receives an output signal from the first filter and an output signal from the second filter and performs differential A/D conversion thereon, and
    wherein the switching mixer includes:
        a first switching element that is provided between the first input node and the first output node;
        a second switching element that is provided between the first input node and the second output node;
        a third switching element that is provided between the second input node and the first output node; and
        a fourth switching element that is provided between the second input node and the second output node.

2. The detection device according to claim 1,
    wherein the first voltage output circuit is a first electric charge-voltage conversion circuit which converts electric charge of the first detection signal into a voltage, and
    wherein the second voltage output circuit is a second electric charge-voltage conversion circuit which converts electric charge of the second detection signal into a voltage.

3. The detection device according to claim 2,
    wherein the first gain adjustment amplifier and the second gain adjustment amplifier have frequency characteristics of a high-pass filter.

4. A sensor comprising:
    the detection device according to claim 3; and
    the physical quantity transducer.

5. An electronic apparatus comprising the detection device according to claim 3.

6. A moving object comprising the detection device according to claim 3.

7. The detection device according to claim 2,
    wherein the first gain adjustment amplifier has frequency characteristics of a high-pass filter which reduces 1/f noise of the first electric charge-voltage conversion circuit, and the second gain adjustment amplifier has frequency characteristics of a high-pass filter which reduces 1/f noise of the second electric charge-voltage conversion circuit.

8. The detection device according to claim 2,
    wherein each of the first and second electric charge-voltage conversion circuits includes
        an operational amplifier that has a first input terminal whose potential is fixed to a predetermined potential;
        a capacitor that is provided between an output node and a node of a second input terminal of the operational amplifier; and
        a resistive element that is provided between the output node and the node of the second input terminal of the operational amplifier.

9. A sensor comprising:
    the detection device according to claim 2; and
    the physical quantity transducer.

10. An electronic apparatus comprising the detection device according to claim 2.

11. A moving object comprising the detection device according to claim 2.

12. The detection device according to claim 1,
    wherein each of the first and second gain adjustment amplifiers includes
        an operational amplifier that has a first input terminal whose potential is fixed to a predetermined potential;
        a first capacitor that is provided between an input node and a node of a second input terminal of the operational amplifier;
        a second capacitor that is provided between an output node and the node of the second input terminal of the operational amplifier; and
        a resistive element that is provided between the output node and the node of the second input terminal of the operational amplifier.

13. The detection device according to claim 1,
    wherein the first and second filters are passive filters formed by passive elements.

14. The detection device according to claim 13,
    wherein the output signal from the first filter and the output signal from the second filter are input to the A/D conversion circuit directly or only through passive elements.

15. The detection device according to claim 1,
wherein the first filter includes
a resistive element that is provided between the first output node of the switching mixer and a first connection node; and
a capacitor that is provided between the first connection node and a node whose potential is fixed to a predetermined potential, and
wherein the second filter includes
a resistive element that is provided between the second output node of the switching mixer and a second connection node; and
a capacitor that is provided between the second connection node and a node fixed to a predetermined potential.

16. A sensor comprising:
the detection device according to claim 1; and
the physical quantity transducer.

17. An electronic apparatus comprising the detection device according to claim 1.

18. A moving object comprising the detection device according to claim 1.

* * * * *